(12) United States Patent
Zhang et al.

(10) Patent No.: US 11,107,951 B2
(45) Date of Patent: Aug. 31, 2021

(54) HETEROSTRUCTURE FOR LIGHT EMITTING DEVICE OR PHOTODETECTOR AND LIGHT-EMITTING DEVICE EMPLOYING THE SAME

(71) Applicant: BOLB INC., San Jose, CA (US)

(72) Inventors: Jianping Zhang, San Jose, CA (US); Ying Gao, San Jose, CA (US); Ling Zhou, San Jose, CA (US)

(73) Assignee: BOLB INC., Livermore, CA (US)

( * ) Notice: Subject to any disclaimer, the term of this patent is extended or adjusted under 35 U.S.C. 154(b) by 0 days.

(21) Appl. No.: 16/294,816

(22) Filed: Mar. 6, 2019

(65) Prior Publication Data

US 2020/0287086 A1 Sep. 10, 2020

(51) Int. Cl.

| | |
|---|---|
| *H01L 33/32* | (2010.01) |
| *H01L 33/06* | (2010.01) |
| *H01L 31/0352* | (2006.01) |
| *H01L 31/0304* | (2006.01) |
| *H01L 31/102* | (2006.01) |

(52) U.S. Cl.
CPC ...... *H01L 33/325* (2013.01); *H01L 31/03042* (2013.01); *H01L 31/03048* (2013.01); *H01L 31/035236* (2013.01); *H01L 31/102* (2013.01); *H01L 33/06* (2013.01)

(58) Field of Classification Search
CPC .............. H01L 33/325; H01L 33/06; H01L 31/035236; H01L 31/03048; H01L 31/03042; H01L 31/102; H01L 31/035263; H01L 33/30–325; H01L 33/002; H01L 33/0025; H01L 33/0062–0075; H01L 31/0352–035272; H01L 21/02584; H01L 29/365
See application file for complete search history.

(56) References Cited

U.S. PATENT DOCUMENTS

| | | | |
|---|---|---|---|
| 5,831,277 A | 11/1998 | Razeghi | |
| 6,104,039 A | 8/2000 | Asatsuma et al. | |
| 8,426,225 B2 | 4/2013 | Shatalov et al. | |
| 10,833,221 B2* | 11/2020 | Zhang | H01L 31/035263 |
| 10,916,680 B2* | 2/2021 | Zhang | H01L 31/035236 |
| 10,950,750 B2* | 3/2021 | Zhang | C09K 11/0883 |
| 2003/0227061 A1* | 12/2003 | Yokogawa | H01L 29/7725 257/379 |
| 2009/0072254 A1* | 3/2009 | Chakraborty | H01L 29/2003 257/97 |

OTHER PUBLICATIONS

Schubert, E. F. et al., "Enhancement of deep acceptor activation in semiconductors by superlattice doping" Applied Physics Letters, vol. 69, No. 24, (Dec. 9, 1996), pp. 3737-3739.

(Continued)

*Primary Examiner* — Laura M Menz
*Assistant Examiner* — Candice Chan
(74) *Attorney, Agent, or Firm* — J.C. Patents

(57) ABSTRACT

Heterostructures containing one or more sheets of positive charge, or alternately stacked AlGaN barriers and AlGaN wells with specified thickness are provided. Also provided are multiple quantum well structures and p-type contacts. The heterostructures, the multiple quantum well structures and the p-type contacts can be used in light emitting devices and photodetectors.

7 Claims, 33 Drawing Sheets

(56) References Cited

OTHER PUBLICATIONS

Yu, Edward T., "Spontaneous and piezoelectric polarizationin nitride heterostructures" Book chapter for inclusion in III-V Nitride Semiconductors : Applications and Devices, Chapter 4, (2003), Published by Taylor & Francis.

Zhang, J. P. et al., "Milliwatt power deep ultraviolet light-emitting diodes over sapphire with emission at 278 nm" Applied Physics Letters, vol. 81, No. 26, (Dec. 23, 2002), pp. 4910-4912.

* cited by examiner

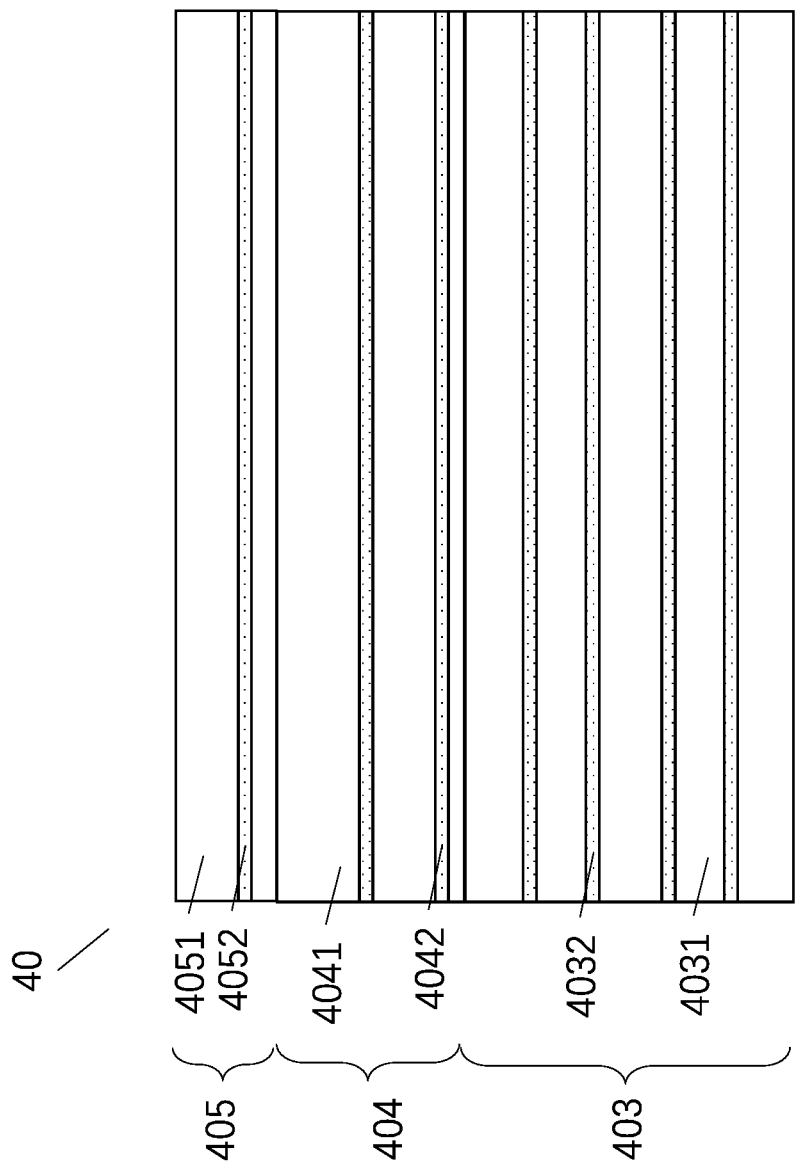

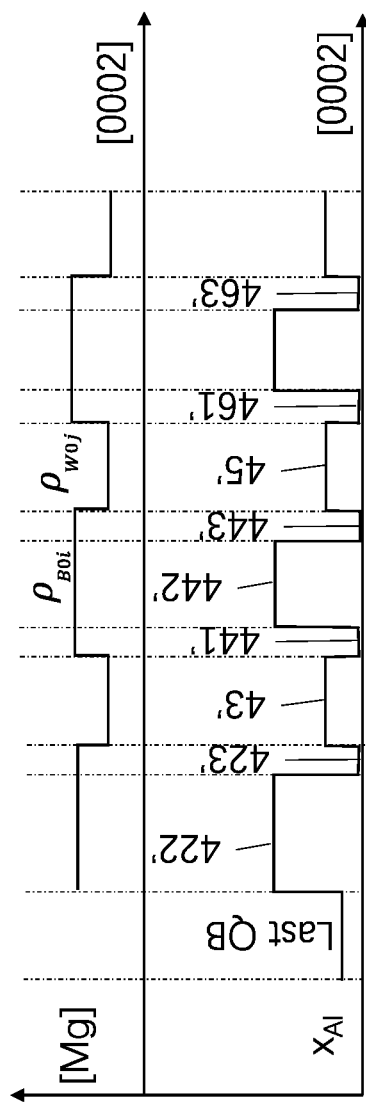
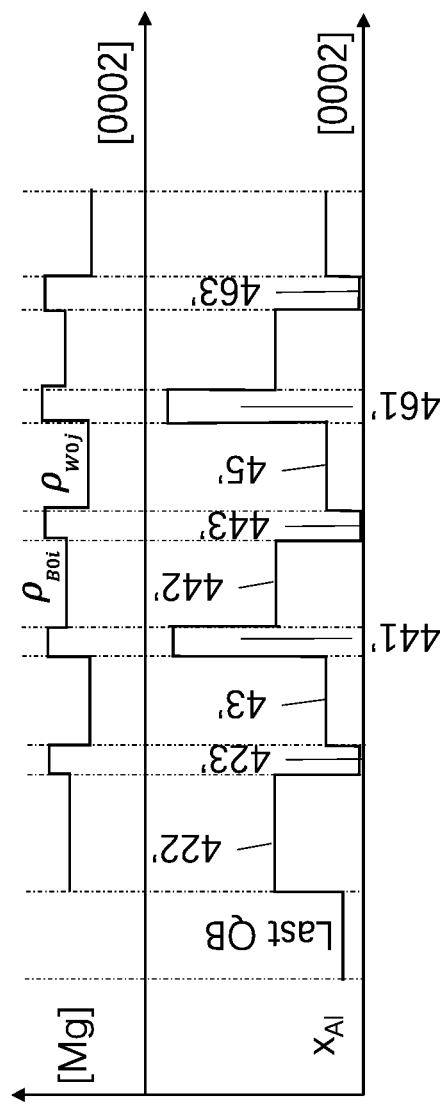
FIG. 16C
FIG. 16D

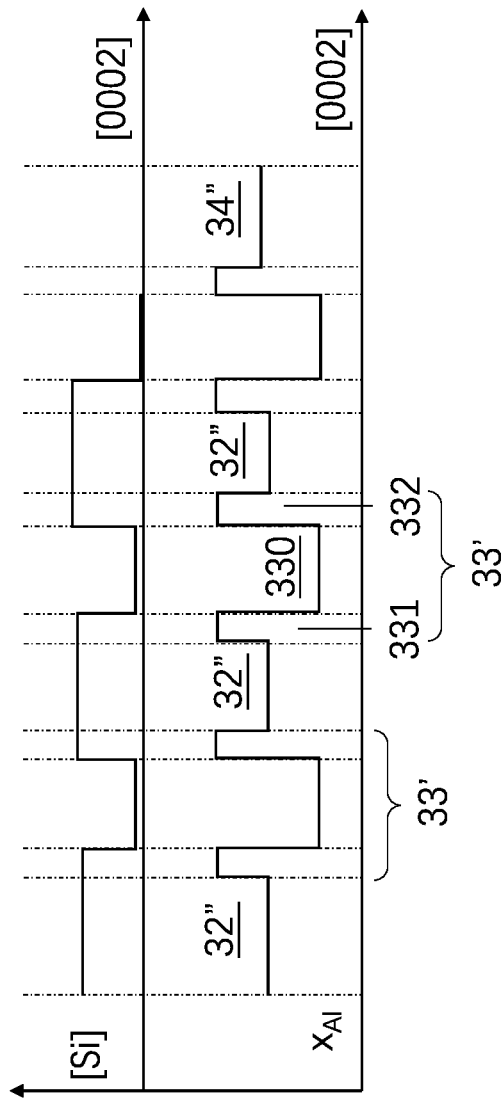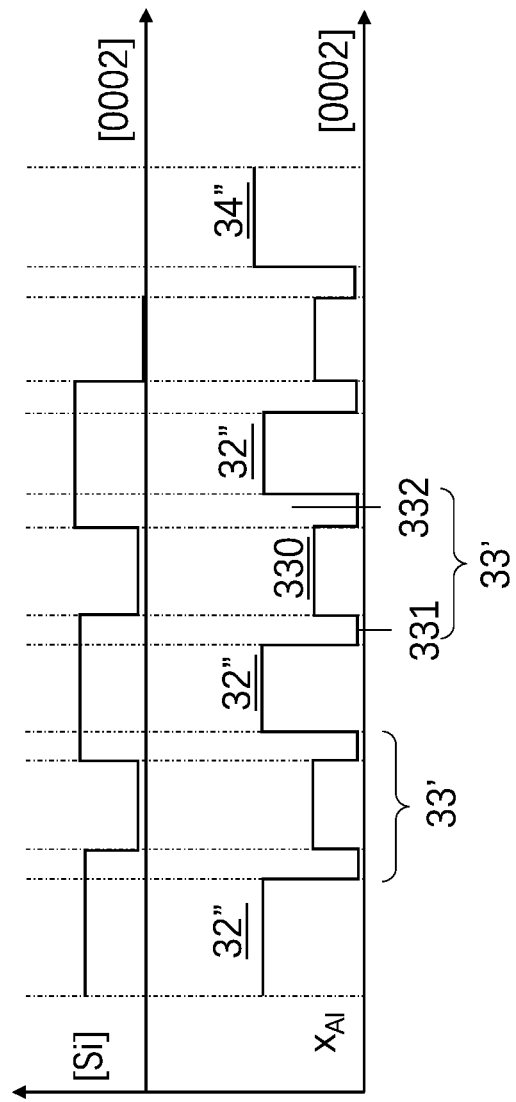
FIG. 21A
FIG. 21B

HETEROSTRUCTURE FOR LIGHT EMITTING DEVICE OR PHOTODETECTOR AND LIGHT-EMITTING DEVICE EMPLOYING THE SAME

FIELD OF THE INVENTION

The present disclosure relates in general to semiconductor light emitting technology and, more particularly, to heterostructures for light emitting devices or photodetectors, and to light emitting devices and photodetectors with the heterostructures.

DESCRIPTION OF THE RELATED ART

Nitride compound semiconductors such as InN, GaN, AlN, and their ternary and quaternary alloys depending on alloy composition enable ultraviolet (UV) emissions ranging from 410 nm approximately to 200 nm. These include UVA (400-315 nm), UVB (315-280 nm), and part of UVC (280-200 nm) emissions. UVA emissions lead to revolutions in curing industry, and UVB and UVC emissions owing to their germicidal effect are looking forward to general adoption in food, water, and surface disinfection businesses. Compared to the traditional UV light sources, such as mercury lamps, UV light emitters made of nitride compounds offer intrinsic merits. In general, nitride UV emitters are robust, compact, spectrum adjustable, and environmentally friendly. They offer high UV light intensity, facilitating an ideal disinfection/sterilization treatment for water, air, food and object surface. Further, nitride UV emitters can deliver intensity-modulated light output at high frequencies, up to a few hundreds of mega-hertz, promising them to be innovative light sources for Internet of Things, covert communications and bio-chemical detections.

The state-of-the-art UVC light-emitting diodes (LEDs) commonly adopt a laminate structure containing a c-plane sapphire or AlN as UV transparent substrate, an AlN layer coated over the substrate serving as epitaxy template, and a set of AlN/AlGaN superlattice for dislocation and strain management. AlN/AlGaN superlattice and/or AlN template enables growth of high-quality high-conductivity n-type AlGaN structure, as electron supplier layer injecting electrons into the following AlGaN-based multiple quantum well (MQW) active-region. On the other side of the MQW active-region is a p-type AlGaN structure consisting of p-type AlGaN layers for electron-blockage, hole injection, hole supply and p-type ohmic contact formation. A conventional AlGaN UV LED structures can be found in the reference. (e.g., "Milliwatt power deep ultraviolet light-emitting diodes over sapphire with emission at 278 nm", J. P. Zhang, et al, APPLIED PHYSICS LETTERS 81, 4910 (2002), the content of which is incorporated herein by reference in its entirety.).

As seen, a UVC LED may utilize numerous AlGaN layers of different Al-compositions to form AlGaN heterostructures so as to realize certain functionalities. A most important functionality is electrical conduction, which becomes increasingly challenging for Al-richer AlGaN materials, as donor and acceptor activation energies increase with Al-composition, resulting in deficiency of free electron and hole carriers. Semiconductor superlattice, a special type semiconductor heterostructure, made by periodically alternately stacking at least two semiconductors of different bandgaps and taking the advantage of conduction and valence band edge discontinuities can enhance dopant activation to improve electrical conductivity (see, for example, "Enhancement of deep acceptor activation in semiconductors by superlattice doping", E. F. Schubert, W. Grieshaber and I. D. Goepfert, Appl. Phys. Lett. 69, 9 (1996)). P-type $Al_xGa_{1-x}N/Al_yGa_{1-y}N$ superlattice has been proposed to replace conventional p-type AlGaN layers for improved conductivity (e.g. U.S. Pat. Nos. 5,831,277, 6,104,039, and 8,426,225, the contents of which are incorporated herein by reference in their entirety).

The present invention discloses design rules for AlGaN heterostructures of improved conductivity and quantum confinement in regard to dopant concentration and interface charge density.

SUMMARY OF THE INVENTION

A first aspect of the present invention provides a heterostructure for a light emitting device or a photodetector, which includes one or more p-type doped AlGaN layers, each of the one or more p-type doped AlGaN layers containing one or more sheets of positive charge inserted therein, wherein a distance between two adjacent sheets of positive charge is larger than a depletion depth of a depletion zone generated by any one of the two adjacent sheets of positive charge.

Optionally, the depletion depth of a depletion zone generated by any one of the one or more sheets of positive charge is less than 10 nm.

The one or more sheets of positive charge can be formed by Si-delta doping with a sheet doping density of $1\times10^{11}$-$1\times10^{13}$ cm$^{-2}$.

The p-type doped AlGaN layer to be placed closest to an active-region of the light emitting device or photodetector, compared with the rest of the one or more p-type doped AlGaN layers, may contain more sheets of positive charge, higher Al-composition, and larger thickness.

The heterostructure may further include a plurality of p-type doped AlGaN layers, which do not contain a sheet of positive charge therein, alternately stacked with the one or more p-type doped AlGaN layers containing one or more sheets of positive charge, wherein an Al-composition of each of the plurality of p-type doped AlGaN layers which do not contain a sheet of positive charge therein is higher than an Al-composition of neighboring p-type doped AlGaN layers containing one or more sheets of positive charge, or an Al-composition of each of the plurality of p-type doped AlGaN layers which do not contain a sheet of positive charge therein is lower than an Al-composition of neighboring p-type doped AlGaN layers containing one or more sheets of positive charge.

Optionally, the sheet of positive charge divides each of the one or more p-type doped AlGaN layers containing one or more sheets of positive charge into a thinner prior zone and a thicker post zone.

The heterostructure may further include another p-type doped AlGaN layer on which the one or more p-type doped AlGaN layers are formed, wherein the another p-type doped AlGaN layer has an Al-composition in the range of 0.6-0.8 and a thickness in the range of 1.0-5.0 nm.

A second aspect of the present invention provides a heterostructure for a light emitting device or a photodetector, which includes alternately stacked p-type doped AlGaN barriers and p-type doped AlGaN wells, wherein a thickness of each of the AlGaN barriers and the AlGaN wells respectively satisfies:

$$h_i \leq -\frac{\sigma_i}{2\rho_{0i}},$$

where $h_i$ is the thickness of $i^{th}$ AlGaN barrier or well; $\sigma_i$ is sheet charge density of a sheet of charge on a surface of the $i^{th}$ AlGaN barrier or well, the surface being oppositely charged in regard to net activated dopant in the $i^{th}$ AlGaN barrier or well; and $\rho_{0i}=eN_{Di}-eN_{Ai}$ is maximal bulk charge density, allowed by applied doping concentration, in a depletion zone of the $i^{th}$ AlGaN barrier or well generated by the sheet of charge, $N_{Di}$ and $N_{Ai}$ are donor and acceptor concentrations, respectively, in the $i^{th}$ AlGaN barrier or well, e is electric elementary charge.

Optionally, at least one of the AlGaN barriers includes an AlGaN prior-barrier spacer, an AlGaN post-barrier spacer, and an AlGaN main barrier sandwiched between the AlGaN prior-barrier spacer and the AlGaN post-barrier spacer, wherein an Al-composition of the AlGaN prior-barrier spacer and an Al-composition of the AlGaN post-barrier spacer are different than an Al-composition of the AlGaN main barrier, and a thickness of the AlGaN prior-barrier spacer and a thickness of the AlGaN post-barrier spacer are smaller than a thickness of the AlGaN main barrier.

Optionally, a thickness of the AlGaN prior-barrier spacer and a thickness of the AlGaN post-barrier spacer are in the range of 0.1 nm to 1.5 nm.

Optionally, the Al-composition of the AlGaN prior-barrier spacer and the Al-composition of the AlGaN post-barrier spacer are higher than the Al-composition of the AlGaN main barrier.

Optionally, the AlGaN prior-barrier spacer and the AlGaN post-barrier spacer are made of AlN and have a thickness in the range of 0.26-0.52 nm, respectively.

Optionally, the Al-composition of the AlGaN prior-barrier spacer and the Al-composition of the AlGaN post-barrier spacer are lower an Al-composition of adjacent AlGaN well.

Optionally, the AlGaN prior-barrier spacer and the AlGaN post-barrier spacer are made of GaN and have a thickness in the range of 0.1-0.52 nm, respectively.

Optionally, the Al-composition of the AlGaN prior-barrier spacer is higher than the Al-composition of the AlGaN main barrier and the Al-composition of the AlGaN post-barrier spacer is lower an Al-composition of adjacent AlGaN well; or the Al-composition of the AlGaN post-barrier spacer is higher than the Al-composition of the AlGaN main barrier and the Al-composition of the AlGaN prior-barrier spacer is lower an Al-composition of adjacent AlGaN well.

The heterostructure may further include another p-type doped AlGaN barrier on which the alternately stacked p-type doped AlGaN barriers and p-type doped AlGaN wells are formed, wherein the another p-type doped AlGaN barrier contains a main barrier, which is to be in contact with a last quantum barrier of a MQW active-region of the light emitting device or photodetector, and a post-barrier spacer on which a p-type doped AlGaN barrier of the alternately stacked p-type doped AlGaN barriers and p-type doped AlGaN wells is formed.

A third aspect of the present invention provides a multiple quantum well structure for a light emitting device or a photodetector, which includes alternately stacked AlGaN barriers and AlGaN wells, wherein a thickness of each of the AlGaN barriers and the AlGaN wells respectively satisfies:

$$h_i \leq -\frac{\sigma_i}{2\rho_{0i}},$$

where $h_i$ is the thickness of $i^{th}$ AlGaN barrier or well; $\sigma_i$ is sheet charge density of a sheet of charge on a surface of the $i^{th}$ AlGaN barrier or well, the surface being oppositely charged in regard to net activated dopant in the $i^{th}$ AlGaN barrier or well; and $\rho_{0i}=eN_{Di}-eN_{Ai}$ is maximal bulk charge density, allowed by applied doping concentration, in a depletion zone of the $i^{th}$ AlGaN barrier or well generated by the sheet of charge, $N_{Di}$ and $N_{Ai}$ are donor and acceptor concentrations, respectively, in the $i^{th}$ AlGaN barrier or well, e is electric elementary charge.

Optionally, one or more of the AlGaN wells includes an n-type doped AlGaN prior-well spacer, an n-type doped AlGaN post-well spacer, and an AlGaN main well sandwiched between the n-type doped AlGaN prior-well spacer and the n-type doped AlGaN post-well spacer, wherein an Al-composition of the n-type doped AlGaN prior-well spacer and an Al-composition of the n-type doped AlGaN post-well spacer are different than an Al-composition of the AlGaN main well, and a thickness of the n-type doped AlGaN prior-well spacer and a thickness of the n-type doped AlGaN post-well spacer are smaller than a thickness of the AlGaN main well and a thickness of adjacent AlGaN barrier.

Optionally, the n-type doped AlGaN prior-well spacer and the n-type doped AlGaN post-well spacer are Si-doped with a doping concentration of $1.0-8.0\times10^{18}$ cm$^{-3}$, respectively, the AlGaN main well is undoped or Si-doped with a doping concentration less than $5.0\times10^{17}$ cm$^{-3}$, at least one of the AlGaN barriers is Si-doped with a doping concentration of $1.0-8.0\times10^{18}$ cm$^{-3}$.

Optionally, a thickness of the n-type doped AlGaN prior-well spacer and a thickness of the n-type doped AlGaN post-well spacer are in the range of 0.1 nm to 0.52 nm, respectively.

Optionally, the Al-composition of the n-type doped AlGaN prior-well spacer and the Al-composition of the n-type doped AlGaN post-well spacer are higher than an Al-composition of adjacent AlGaN barrier.

Optionally, the n-type doped AlGaN prior-well spacer and the n-type doped AlGaN post-well spacer are made of AlN and have a thickness in the range of 0.1-0.52 nm, respectively.

Optionally, the Al-composition of the n-type doped AlGaN prior-well spacer and the Al-composition of the n-type doped AlGaN post-well spacer are lower the Al-composition of the AlGaN main well.

Optionally, the n-type doped AlGaN prior-well spacer and the n-type doped AlGaN post-well spacer are made of GaN and have a thickness in the range of 0.1-0.52 nm, respectively.

Optionally, the Al-composition of the n-type doped prior-well spacer is higher than an Al-composition of adjacent AlGaN barrier and the Al-composition of the n-type doped AlGaN post-well spacer is lower the Al-composition of the AlGaN mail well; or the Al-composition of the n-type doped AlGaN post-well spacer is higher than an Al-composition of the AlGaN barrier and the Al-composition of the AlGaN prior-well spacer is lower the Al-composition of the AlGaN main well.

Optionally, one of the n-type doped AlGaN prior-well spacer and the n-type doped AlGaN post-well spacer is made of AlN and the other is made of GaN, and have a thickness in the range of 0.1-0.52 nm, respectively.

The multiple quantum well structure may further include an undoped AlGaN barrier formed on one of the AlGaN wells on one side and to be in contact with a p-type structure of the light emitting device or photodetector on the other side.

Optionally, one or more of the AlGaN barriers contains one or more sheet of positive charge, and a distance between two adjacent sheets of positive charge is larger than a depletion depth of a depletion zone generated by any one of the two adjacent sheets of positive charge.

Optionally, the sheets of positive charge are formed via Si-delta doping with a sheet doping density equal to or greater than $10^{12}$ cm$^{-2}$.

Optionally, each of the AlGaN barriers that contain the sheet of positive charge comprises a Si-doped layer with a doping concentration of 1.0-8.0×10$^{18}$ cm$^{-3}$ and an undoped layer separated by the sheet of positive charge.

Optionally, a thickness of the Si-doped layer of each of the AlGaN barriers that contain the sheet of positive charge is in the range of 6-10 nm, respectively, and a thickness of the undoped layer of each of the AlGaN barriers that contain the sheet of positive charge is in the range of 2-4 nm, respectively.

The multiple quantum well structure may further include an undoped AlGaN barrier formed on one of the AlGaN wells on one side and to be in contact with a p-type structure of the light emitting device or photodetector on the other side.

Optionally, one or more of the AlGaN wells includes an n-type doped AlGaN prior-well spacer, an n-type doped AlGaN post-well spacer, and an AlGaN main well sandwiched between the n-type doped AlGaN prior-well spacer and the n-type doped AlGaN post-well spacer, wherein an Al-composition of the n-type doped AlGaN prior-well spacer and an Al-composition of the n-type doped AlGaN post-well spacer are different than an Al-composition of the AlGaN main well, and a thickness of the n-type doped AlGaN prior-well spacer and a thickness of the n-type doped AlGaN post-well spacer are smaller than a thickness of the AlGaN main well and a thickness of adjacent AlGaN barrier.

Optionally, the n-type doped AlGaN prior-well spacer and the n-type doped AlGaN post-well spacer are Si-doped with a doping concentration of 1.0×10$^{18}$-8.0×10$^{18}$ cm$^{-3}$, respectively, the AlGaN main well is undoped or Si-doped with a doping concentration less than 5.0×10$^{17}$ cm$^{-3}$, at least one of the AlGaN barriers is Si-doped with a doping concentration of 1.0×10$^{18}$-8.0×10$^{18}$ cm$^{-3}$.

Optionally, a thickness of the n-type doped AlGaN prior-well spacer and a thickness of the n-type doped AlGaN post-well spacer are in the range of 0.1 nm to 0.52 nm, respectively.

Optionally, the Al-composition of the n-type doped AlGaN prior-well spacer and the Al-composition of the n-type doped AlGaN post-well spacer are higher than an Al-composition of adjacent AlGaN barrier.

Optionally, the Al-composition of the n-type doped AlGaN prior-well spacer and the Al-composition of the n-type doped AlGaN post-well spacer are lower the Al-composition of the AlGaN main well.

Optionally, the Al-composition of the n-type doped prior-well spacer is higher than an Al-composition of adjacent AlGaN barrier and the Al-composition of the n-type doped AlGaN post-well spacer is lower the Al-composition of the AlGaN mail well; or the Al-composition of the n-type doped AlGaN post-well spacer is higher than an Al-composition of the AlGaN barrier and the Al-composition of the AlGaN prior-well spacer is lower the Al-composition of the AlGaN main well.

A fourth aspect of the present invention provides a heterostructure for a light emitting device or a photodetector, which includes alternately stacked n-type doped $Al_bGa_{1-b}N$ barriers and n-type doped $Al_wGa_{1-w}N$ wells, wherein a thickness of each of the n-type doped $Al_bGa_{1-b}N$ barriers and the n-type doped $Al_wGa_{1-w}N$ wells respectively satisfies:

$$L_i \leq \left(\frac{b-w}{0.2}\right)10^{13}\frac{1}{2N_{Di}} \times 10^7 \text{ nm},$$

where $L_i$ is the thickness of the $i^{th}$ $Al_bGa_{1-b}N$ barrier or $Al_wGa_{1-w}N$ well, $N_{Di}$ is donor concentration (in cm$^{-3}$) in the $i^{th}$ $Al_bGa_{1-b}N$ barrier or $Al_wGa_{1-w}N$ well.

Optionally, the n-type doped $Al_bGa_{1-b}N$ barriers and n-type doped $Al_wGa_{1-w}N$ wells are Si-doped with a doping concentration of 8.0×10$^{18}$-2.0×10$^{19}$ cm$^{-3}$, and b−w is equal to or larger than 0.15.

Optionally, one or more of the n-type doped $Al_bGa_{1-b}N$ barriers contains a Si-delta doped zone.

Optionally, an n-type doped AlGaN prior-barrier spacer and an n-type doped AlGaN post-barrier spacer are formed on two sides of at least one of the n-type doped $Al_bGa_{1-b}N$ barriers, respectively, wherein an Al-composition of the n-type doped AlGaN prior-barrier spacer and an Al-composition of the n-type doped AlGaN post-barrier spacer are different than an Al-composition of the at least one of the n-type doped $Al_bGa_{1-b}N$ barriers, and a thickness of the n-type doped AlGaN prior-barrier spacer and a thickness of the n-type doped AlGaN post-barrier spacer are smaller than a thickness of the least one of the n-type doped $Al_bGa_{1-b}N$ barriers.

Optionally, a thickness of the n-type doped AlGaN prior-barrier spacer and a thickness of the n-type doped AlGaN post-barrier spacer are in the range of 0.1 nm to 1.5 nm.

Optionally, the Al-composition of the n-type doped AlGaN prior-barrier spacer and the Al-composition of the AlGaN post-barrier spacer are higher than the Al-composition of the at least one of the n-type doped $Al_bGa_{1-b}N$ barriers.

Optionally, the Al-composition of the AlGaN prior-barrier spacer and the Al-composition of the AlGaN post-barrier spacer are lower an Al-composition of adjacent n-type doped $Al_wGa_{1-w}N$ well.

Optionally, the Al-composition of the AlGaN prior-barrier spacer is higher than the Al-composition of the at least one of the n-type doped $Al_bGa_{1-b}N$ barriers and the Al-composition of the AlGaN post-barrier spacer is lower an Al-composition of adjacent n-type doped $Al_wGa_{1-w}N$ well; or the Al-composition of the AlGaN post-barrier spacer is higher than the Al-composition of the at least one of the n-type doped $Al_bGa_{1-b}N$ barriers and the Al-composition of the AlGaN prior-barrier spacer is lower an Al-composition of adjacent n-type doped $Al_wGa_{1-w}N$ well.

A fifth aspect of the present invention provides a p-type contact structure for a light emitting device or a photodetector, which includes:

a first AlGaN barrier;
a first AlInGaN well formed on the first AlGaN barrier;
a second AlGaN barrier formed on first AlInGaN well; and
a second AlInGaN well formed on the second AlGaN barrier;
wherein a difference between an Al-composition of the first AlGaN barrier and an Al-composition of the first AlInGaN well is equal to or larger than 0.6, and a difference between an Al-composition of the second AlGaN barrier and an Al-composition of the second AlInGaN well is equal to or larger than 0.6.

Optionally, at least one of the first AlGaN barrier and the second AlGaN barrier are made of AlN.

Optionally, at least one of the first AlInGaN well and the second AlInGaN well are made of $In_xGa_{1-x}N$, where x is equal to or smaller than 0.3.

Optionally, a thickness of the first AlGaN barrier and a thickness of the second AlGaN barrier are in the range of 0.26-2.0 nm, respectively.

Optionally, a thickness of the first AlInGaN well and a thickness of the second AlInGaN well are in the range of 0.52-3.0 nm, respectively.

Optionally, the first AlInGaN well is p-type doped with a doping concentration of $5.0\times10^{19}$-$3.0\times10^{20}$ cm$^{-3}$, and the second AlInGaN well is n-type doped with a doping concentration of $1.0\times10^{19}$-$1.5\times10^{20}$ cm$^{-3}$.

Optionally, the first AlGaN barrier is p-type doped with a doping concentration of $5.0\times10^{19}$-$3.0\times10^{20}$ cm$^{-3}$, and the second AlGaN barrier is p-type doped with a doping concentration of $5.0\times10^{19}$-$3.0\times10^{20}$ cm$^{-3}$.

The p-type contact structure may further include a AlGaN layer on which the first AlGaN barrier is formed, wherein the AlGaN layer on which the first AlGaN barrier is formed has an Al-composition lower than the Al-composition of the first AlGaN barrier and in the range of 0.5-0.65, a thickness in the range of 2.0-5.0 nm, and is p-type doped with a doping concentration of $5.0\times10^{19}$-$3.0\times10^{20}$ cm$^{-3}$.

A sixth aspect of the present invention provides a light emitting device as follows:

A light emitting device includes:
an n-type AlGaN structure;
a p-type AlGaN structure; and
an active-region sandwiched between the n-type AlGaN structure and the p-type AlGaN structure,
wherein the p-type AlGaN structure includes the heterostructure according to the first aspect of the present invention.

A light emitting device includes:
an n-type AlGaN structure;
a p-type AlGaN structure; and
an active-region sandwiched between the n-type AlGaN structure and the p-type AlGaN structure,
wherein the p-type AlGaN structure includes the heterostructure according to the second aspect of the present invention.

A light emitting device includes:
an n-type AlGaN structure;
a p-type AlGaN structure; and
an active-region sandwiched between the n-type AlGaN structure and the p-type AlGaN structure,
wherein the active-region includes the multiple quantum well structure according to the third aspect of the present invention.

A light emitting device includes:
an n-type AlGaN structure;
a p-type AlGaN structure; and
an active-region sandwiched between the n-type AlGaN structure and the p-type AlGaN structure,
wherein the n-type AlGaN structure includes the heterostructure according to the fourth aspect of the present invention.

A light emitting device includes:
an n-type AlGaN structure;
a p-type AlGaN structure;
an active-region sandwiched between the n-type AlGaN structure and the p-type AlGaN structure; and
the p-type contact structure according to the fifth aspect of the present invention formed on the p-type AlGaN structure.

The heterostructure, the multiple quantum well structure and the p-type contact structure according to the above first to fifth aspects of the present invention can be applied, individually or in any combination thereof, to any suitable light emitting device or photodetector.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 10 illustrates a cross-sectional view of a p-type AlGaN structure according to another embodiment of the present invention.

FIG. 16C illustrates one possible combination of dopant and composition profiles of the p-type AlGaN heterostructure shown in FIG. 15.

FIG. 16D illustrates one possible combination of dopant and composition profiles of the p-type AlGaN heterostructure shown in FIG. 15.

FIG. 21A illustrates one possible combination of dopant and composition profiles of the MQW 30 shown in FIG. 20.

FIG. 21B illustrates one possible combination of dopant and composition profiles of the MQW 30 shown in FIG. 20.

DETAILED DESCRIPTION OF EMBODIMENTS

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence has marginal or negligible effect on the overall material characteristics such as lattice constant, bandgap and conductivity. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

A semiconductor can be doped with donors, or acceptors, and the semiconductor is called n-type or p-type doped, or n- or p-semiconductor, respectively. Donors and acceptors respectively release carrier electrons and holes into the host semiconductor, therefore, activated or ionized donors and acceptors are positive and negative immobile charged ions sitting in the host semiconductor lattice, respectively.

In general, two semiconductors of different bandgap width (usually of different lattice constant too) epitaxially formed on one another form a heterostructure. Light emitting devices such as light emitting diodes (LEDs) and laser diodes employ numerous heterostructures, for strain management, dislocation blockage, carrier confinement and light generation. Two special heterostructures, namely, quantum well and superlattice are widely used in LEDs. Generally speaking, a light-emitting device such as an LED can include an n-type AlGaN structure made of n-type AlGaN heterostructure, a p-type AlGaN structure made of p-type AlGaN heterostructure, and a light-emitting heterostructure active-region made of multiple quantum well (MQW) sandwiched between the n-type AlGaN structure and the p-type AlGaN structure.

In the following contents, wurtzite c-plane ((0002) plane) nitride light-emitting devices or structures are used as examples to elucidate the principle and spirit of the present invention. The teachings in this specification and given by the following embodiments can be applied to non-c-plane nitride semiconductors, II-VI semiconductors and other semiconductor devices.

Figure 1:
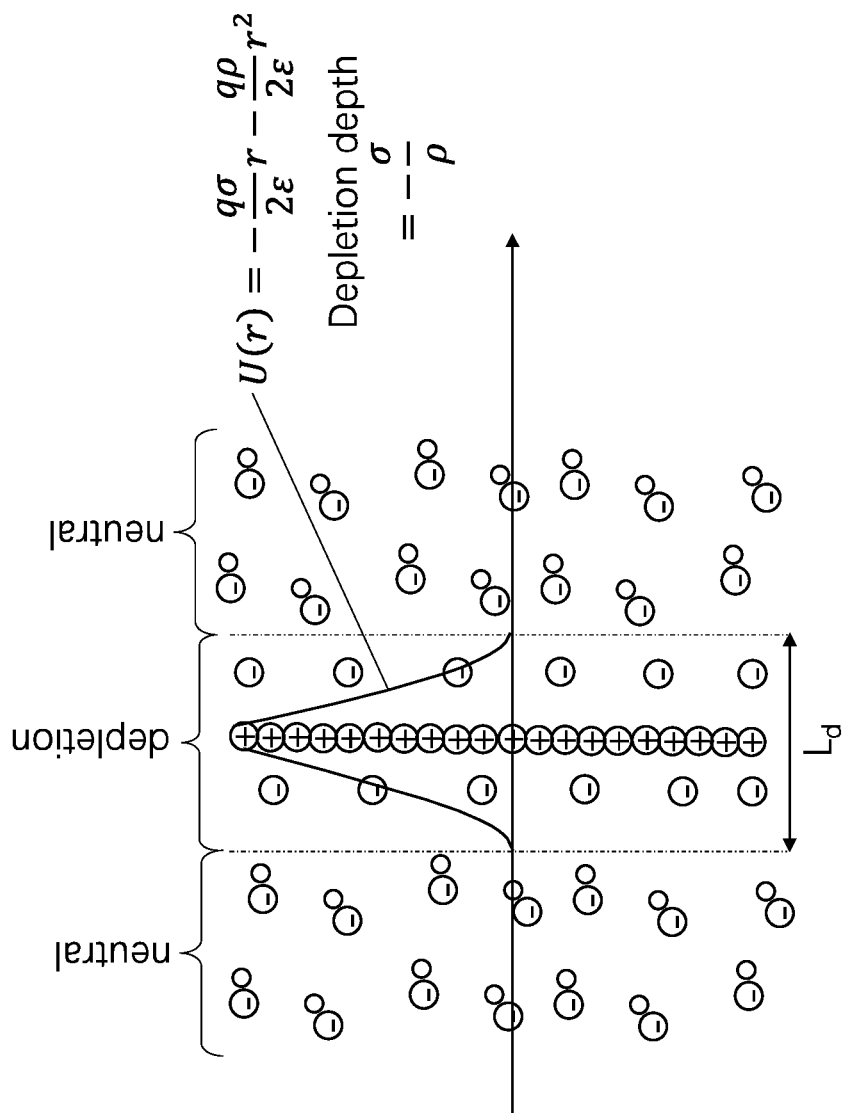
FIG. 1 illustrates a sheet of positive charge (via n-type delta doping) inserted into a thick p-type doped semiconductor.

Illustration in FIG. 1 shows a sheet of positive charge inserted into a thick p-type doped semiconductor, which according to an embodiment of this invention is a p-type doped (e.g. Mg-doped) AlGaN thick layer. Here the positive sheet charge can be achieved via n-type delta doping, usually realized via simultaneously opening n-type dopant source and group V source (e.g., ammonia or nitrogen) while closing group III sources (e.g., Al and Ga) during AlGaN epitaxial growth. The n-type dopants, such as Si, O, or Ge atoms, occupying Al, and/or Ga lattice positions in AlGaN serving as donors, ionize into positive immobile charges via releasing mobile carrier electrons. Similarly, negative sheet charge can be achieved via p-type delta doping, realized via simultaneously opening p-type dopant source and group V source while closing group III sources during AlGaN epitaxial growth. The p-type dopants, such as Mg atoms, occupying Al and/or Ga lattice positions in AlGaN serving as acceptors, ionize into negative immobile charges via releasing mobile carrier holes. In practice, delta doping can also be equivalently realized via heavily doping a very thin layer. For example, doping a 2-nm-thick layer to $5 \times 10^{19}$ cm$^{-3}$, or 1-nm-thick layer to $10^{20}$ cm$^{-3}$ is equivalent to a delta doping of sheet density of $10^{13}$ cm$^{-2}$.

Referring to FIG. 1, the electric field strength E(r) and electric potential U(r) in the vicinity of a sheet of charge can be calculated using Gauss's law considering the left-right symmetry around the sheet charge and assuming the lateral size of the sheet of charge is significantly large than the distance to the sheet charge (r) therefore the sheet of charge being treated as an infinite sheet of charge.

$$E(r) = \frac{\sigma}{2\varepsilon} + \frac{\rho r}{\varepsilon}, \text{ and} \quad \text{(eq. 1)}$$

$$U(r) = -\frac{e\sigma}{2\varepsilon}r - \frac{e\rho}{2\varepsilon}r^2 \quad \text{(eq. 2)}$$

where σ, ε, ρ, r and e are respectively the sheet charge density, permittivity of host AlGaN layer, bulk charge density, distance to the sheet charge, and electric elementary charge. In a doped semiconductor, bulk charge density is the net charge density produced by activated donors and acceptors, i.e., $\rho = eN_D^+ - eN_A^- + ep - en$, where $N_D^+$, $N_A^-$, p, and n are concentrations of ionized donor, acceptor, free hole and electron respectively. In the neutral zone, bulk charge density is zero. In the depletion zone (no free carriers allowed), $\rho = eN_D^+ - eN_A^-$. Note that in the depletion zone, $$\rho = eN_D^+ - eN_A^- \le \rho_0 = eN_D - eN_A \quad \text{(eq. 3)}$$

due to insufficient dopant activation if dopant activation energy is larger than thermal energy (here $N_D$ and $N_A$ are donor and acceptor dopant concentrations, respectively.).

If the sheet of charge is oppositely charged in regard to the net activated dopant, the sheet of charge will enhance the dopant's activation, via electrically repelling carriers away from the dopants. This generates a carrier depletion zone around the sheet of charge. The boundary between the depletion zone and the neutral zone, $r_0$, at which the electric field is zero (E(r)=0), is given by:

$$r_0 = -\frac{\sigma}{2\rho} \quad \text{(eq. 4)}$$

And the depletion depth, $L_d$, is then:

$$L_d = 2r_0 = -\frac{\sigma}{\rho} \quad \text{(eq. 5)}$$

Figure 4:
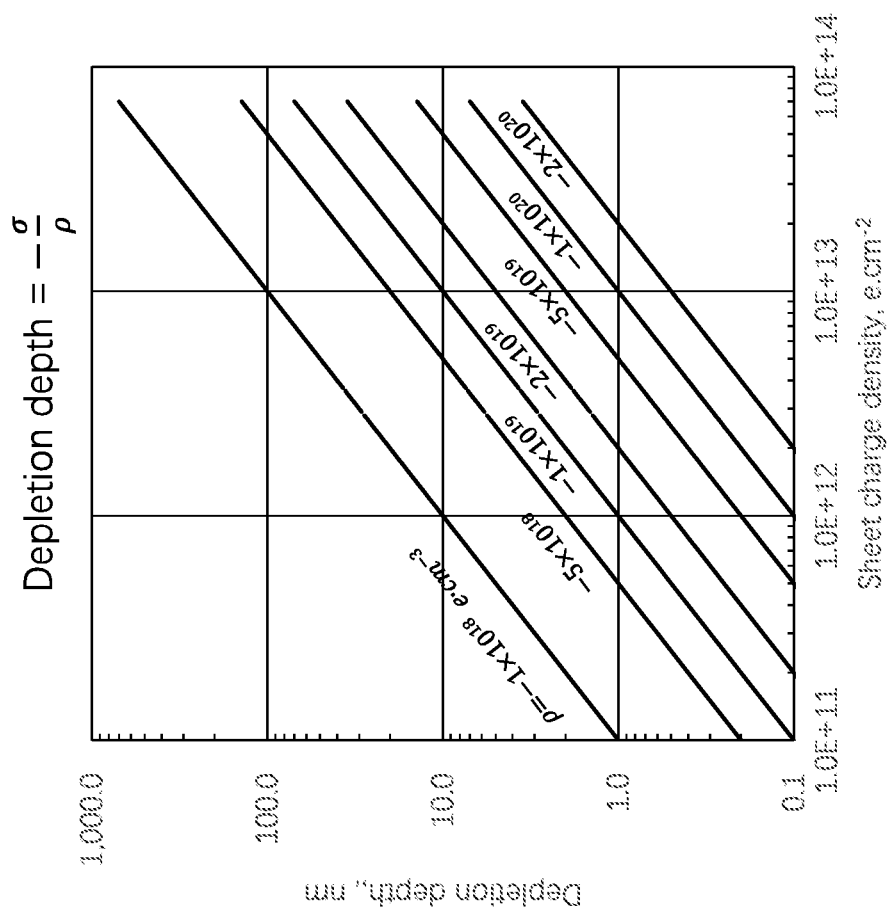
FIG. 4 plots the depletion depth curves for different sheet charge densities and activated dopant levels.

The depletion depth curves are calculated according to eq. 5 and plotted in FIG. 4 for a few exemplary bulk charge densities with the sheet charge density ranging from $10^{11}$-$10^{14}$ e·cm$^{-2}$. As seen, depending on charge allocation, the depletion depth ranges from sub-nanometers to a few hundreds of nanometers.

The maximal potential drop, $\Delta U_{max}$, occurs at the depletion edge where $$r_0 = -\frac{\sigma}{2\rho},$$

$$\Delta U_{max} = U\left(-\frac{\sigma}{2\rho}\right) - U(0) = \frac{e\sigma^2}{8\varepsilon\rho} \quad \text{(eq. 6)}$$

Figure 3A:
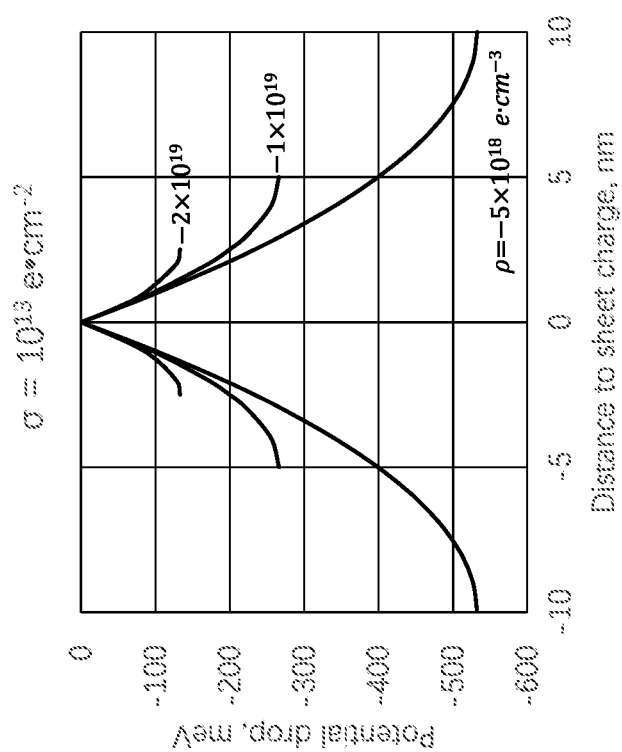
FIG. 3A plots the electric potential curves around a sheet of positive charge ($\sigma=10^{13}$ e·cm$^{-2}$) inserted in a p-type semiconductor with different activated dopant levels.
Figure 3B:
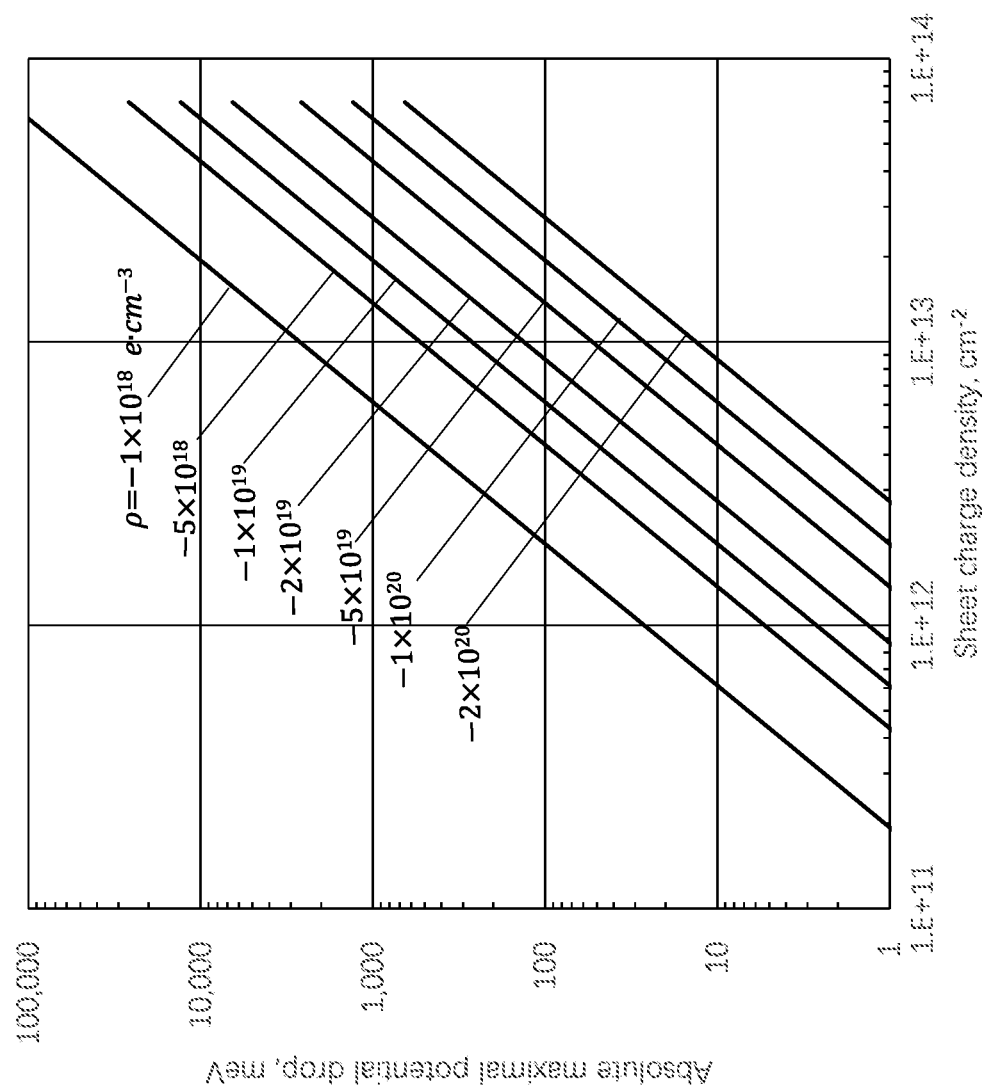
FIG. 3B plots the absolute value of the maximal potential drop generated by a sheet of positive charge inserted in a p-type semiconductor with different activated dopant levels.

The maximal potential drop can be significant, promising for enhancement of deep acceptors' activation in wide bandgap materials such as AlGaN. Plotted in FIG. 3A are some potential curves around a sheet of charge ($\sigma = 10^{13}$ e·cm$^{-2}$) with different bulk charge densities ($\sigma = -5 \times 10^{18}$, $1 \times 10^{19}$, $-2 \times 10^{19}$ e·cm$^{-3}$). As seen, maximal potential drops of a few hundreds of milli-electron-voltage (meV) are realized. More general, the absolute values of the maximal potential drops predicted by eq. 6 are plotted in FIG. 3B. Combining FIGS. 3B and 4, it is desirable to have large maximal potential drop with small depletion depth, for the sake of vertical conduction. This is achievable by using high sheet charge density and high dopant concentration. For example, for $\sigma = 4 \times 10^{13}$ e·cm$^{-2}$ and $N_A^- = -2 \times 10^{20}$ e·cm$^{-3}$ the depletion depth is only 2 nm and the maximal potential drop is 213 meV. This will greatly enhance deep acceptor activation within AlGaN material. For $\sigma \ge 6 \times 10^{13}$ cm$^{-2}$, regardless of dopant level, the maximal potential drop will exceed 500 meV. This means that even heavily Mg-doped AlN will have surface hole accumulation and become conductive, as Mg-acceptor in AlN possesses of activation energy of approximately 500 meV.

Figure 2:
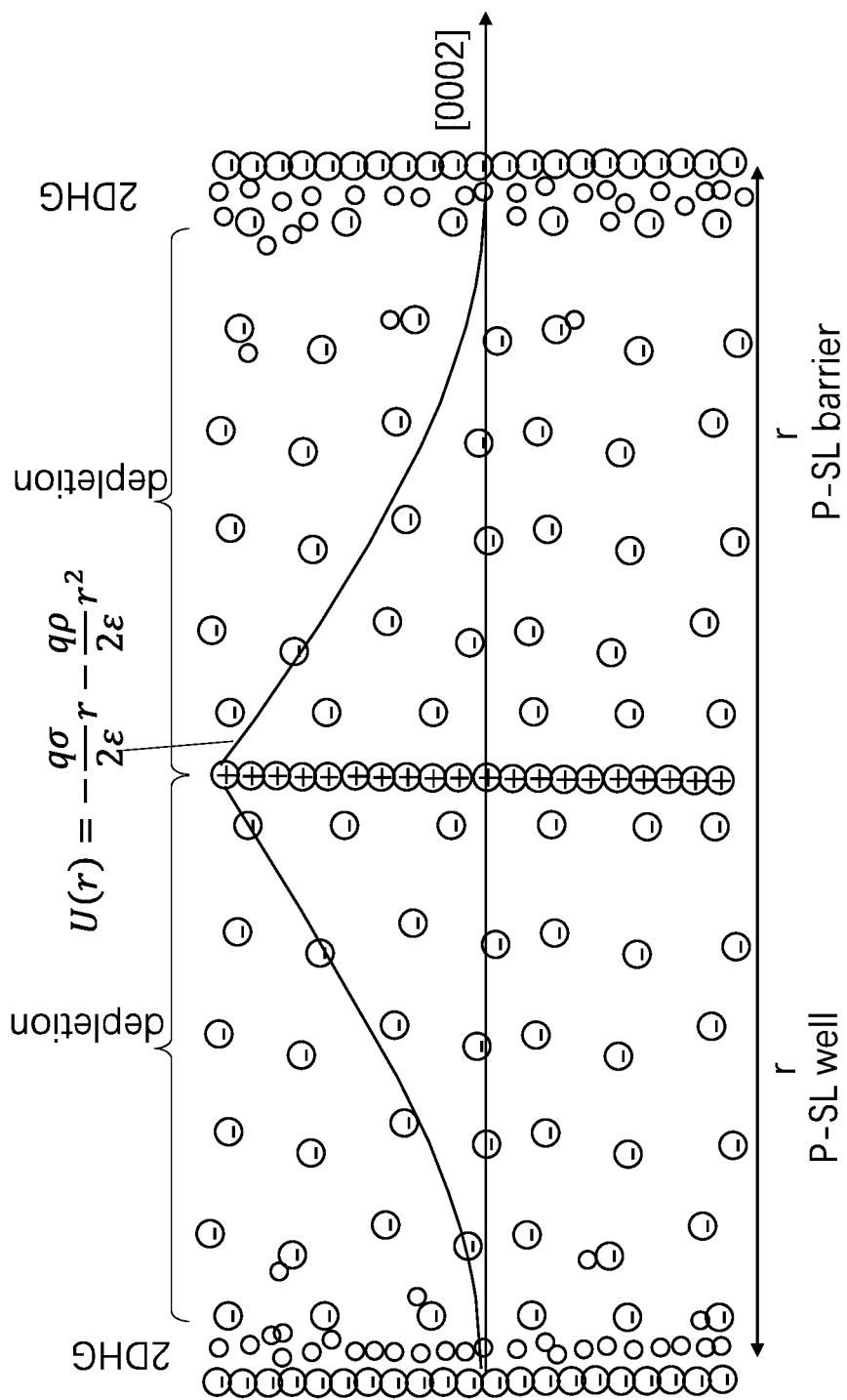
FIG. 2 illustrates a p-type doped heterostructure with sheets of opposite charge generated by polarization discontinuity.

As mentioned previously, infinite sheet of charge can be realized via delta doping, so, n-type and p-type delta doping can introduce positive and negative sheet charges, respectively. Another approach to obtain infinite sheet of charge is to introduce polarization discontinuity, as $\sigma = -\vec{P} \cdot \vec{n}$ ($\vec{P}$ and $\vec{n}$ are polarization and surface normal vectors, respectively), any discontinuity in polarization vector at interface can result in interface sheet charge. Illustrated in FIG. 2 are three infinite sheets of charge, inserted in p-type doped AlGaN, one sheet of positive charge located in the center and two sheets of negative charge at the edge. This can be realized by an AlGaN heterostructure of two higher Al-content AlGaN layers sandwiching a lower Al-content AlGaN layer. Generally speaking, acceptors can be assisted to activate provided that the electric field generated by the sheets of charge is strong enough. More specifically, according to the present invention, if the maximal potential drop is close to (within thermal energy), or larger than the acceptor activation energy, and the depletion depth is less than a few nanometers allowing for quantum tunneling, the acceptors will be sufficiently activated. Upon activation, free holes are pushed away from the sheet of positive charge towards the sheets of negative charge, leading to hole accumulation or two-dimensional hole gas (2DHG) formation in vicinity of the sheets of negative charge.

By symmetry, even though not explicitly shown, the AlGaN heterostructure shown in FIG. 2 can be n-type doped instead of p-type doped. In this case, if the maximal potential drop is close to (within thermal energy), or larger than the donor activation energy, and the depletion depth is within a few nanometers allowing for quantum tunneling, the donors will be sufficiently activated. Upon activation, free electrons are pushed away from the sheets of negative charge towards the sheet of positive charge, leading to electron accumulation or two-dimensional electron gas (2DEG) formation in vicinity of the sheet of positive charge.

According to one aspect of the present invention, to maximize electric field assisted dopant activation and carrier accumulation, an individual layer's (say $i^{th}$ layer's) thickness ($h_i$) within a heterostructure is preferred to satisfy the inequality:

$$h_i \leq -\frac{\sigma_i}{2\rho_{0i}} \leq -\frac{\sigma_i}{2\rho_i} \quad \text{(eq. 7)}$$

where $\rho_i = eN_{Di}^+ - eN_{Ai}^-$ is the bulk charge density in the depletion zone of $i^{th}$ layer ($N_{Di}^+$ and $N_{Ai}^-$ being the respective ionized donor and acceptor concentrations therein), $\sigma_i$ is the sheet charge density on $i^{th}$ layer's surface being oppositely charged in regard to the net activated dopant ($\rho_i$) therein, and $\rho_{0i} = eN_{Di} - eN_{Ai}$ is the maximal charge density in the depletion zone allowed by doping ($N_{Di}$ and $N_{Ai}$ are the respective donor and acceptor concentrations of $i^{th}$ layer).

The inequality given by eq. 7 basically requires that the $i^{th}$ layer's thickness ($h_i$) is within or at the boundary of the depletion zone generated by $\sigma_i$ and $\rho_{0i}$, guaranteeing maximal dopant activation within $i^{th}$ layer and forming carrier accumulation at one surface of $i^{th}$ layer.

Figure 5A:
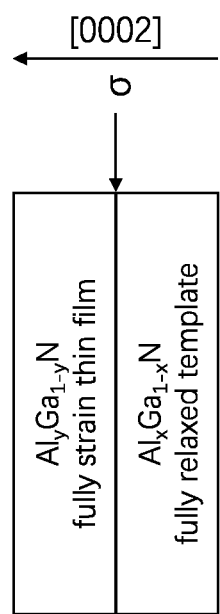
FIG. 5A schematically shows interface polarization sheet charge for a fully strained $Al_xGa_{1-x}N$ thin film grown on a fully relaxed $Al_yGa_{1-y}N$ thick templated.

FIG. 5A illustrates a simple AlGaN heterostructure, with surface normal pointing along [0002] direction and containing a thick fully relaxed $Al_xGa_{1-x}N$ template and a thin fully strained $Al_yGa_{1-y}N$, i.e., $Al_yGa_{1-y}N$ coherently formed on $Al_xGa_{1-x}N$. Because of composition difference there is piezoelectric and spontaneous polarization induced interface sheet charge. Using parameters given by E. T. Yu et al ("Spontaneous and piezoelectric polarization in nitride heterostructures" (by E. T. Yu, chapter 4, III-V Nitride Semiconductors: Applications and Devices, edited by E. T. Yu, and O. Manasreh, published in 2003 by Taylor & Francis), the $Al_yGa_{1-y}N/Al_xGa_{1-x}N$ interface charge densities ($\sigma$) are calculated and plotted in FIGS. 5B and 5C, respectively for y≥x and y≤x.

Figure 5B:
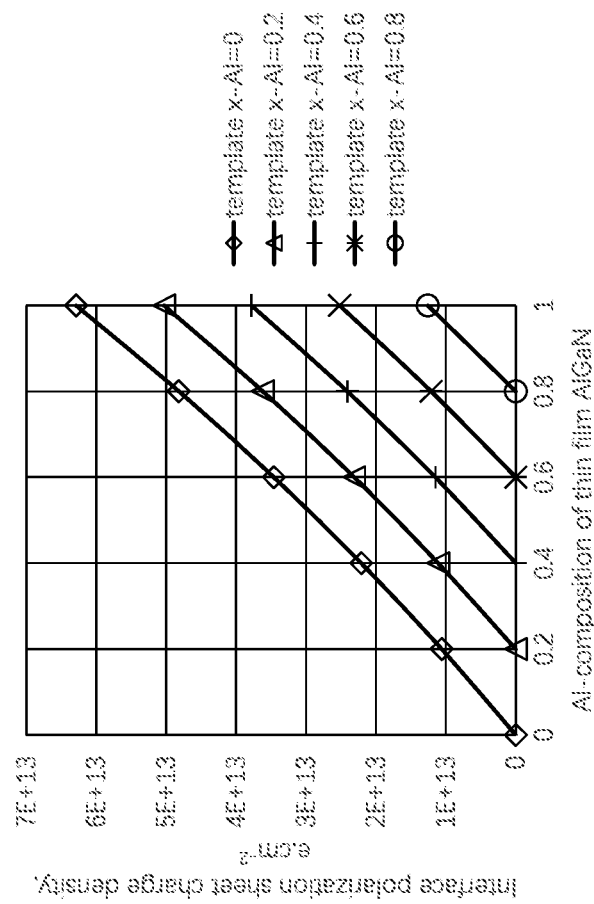
FIG. 5B plots the calculated polarization sheet charge densities for $Al_xGa_{1-x}N$ thin films coherently grown on thick fully relaxed $Al_yGa_{1-y}N$ template, wherein y≤x.
Figure 5C:
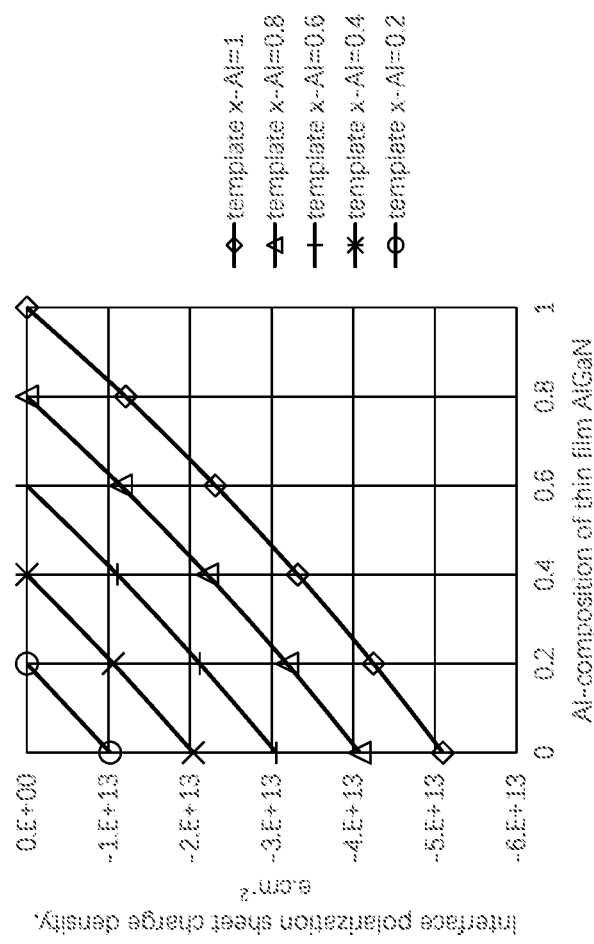
FIG. 5C plots the calculated polarization sheet charge densities for $Al_xGa_{1-x}N$ thin films coherently grown on thick fully relaxed $Al_yGa_{1-y}N$ template, wherein y≥x.

In FIG. 5B, where y≥x, meaning high-Al-composition thin AlGaN film is coherently formed on low-Al-composition thick AlGaN template, positive interface sheet charge is generated at the interface. In FIG. 5C, where y≤x, meaning low-Al-composition thin AlGaN film is coherently formed on high-Al-composition thick AlGaN template, negative sheet charge is generated at the interface. For this simple heterostructure, the interface sheet charge density can be approximately described by:

$$\sigma \cong \left(\frac{y-x}{0.2}\right)10^{13} e \cdot cm^{-2} \quad \text{(eq. 8)}$$

where y and x being Al-compositions of the thin AlGaN film and the thick AlGaN template, respectively.

Figure 6A:
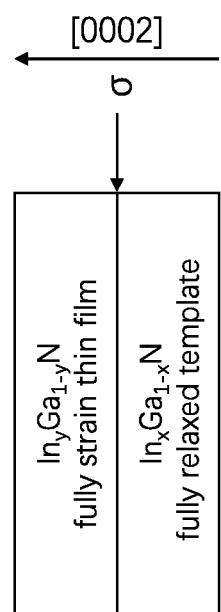
FIG. 6A schematically shows interface polarization sheet charge for a fully strained $In_xGa_{1-x}N$ thin film grown on a fully relaxed $In_yGa_{1-y}N$ thick templated.

FIG. 6A illustrates a simple InGaN heterostructure, with surface normal pointing to [0002] direction and containing a thick fully relaxed $In_xGa_{1-x}N$ template and a thin fully strained $In_yGa_{1-y}N$, i.e., $In_yGa_{1-y}N$ coherently formed on $In_xGa_{1-x}N$. The $In_yGa_{1-y}N/In_xGa_{1-x}N$ interface charge densities ($\sigma$) are calculated and plotted in FIGS. 6B and 6C, respectively for y≥x and y≤x.

Figure 6B:
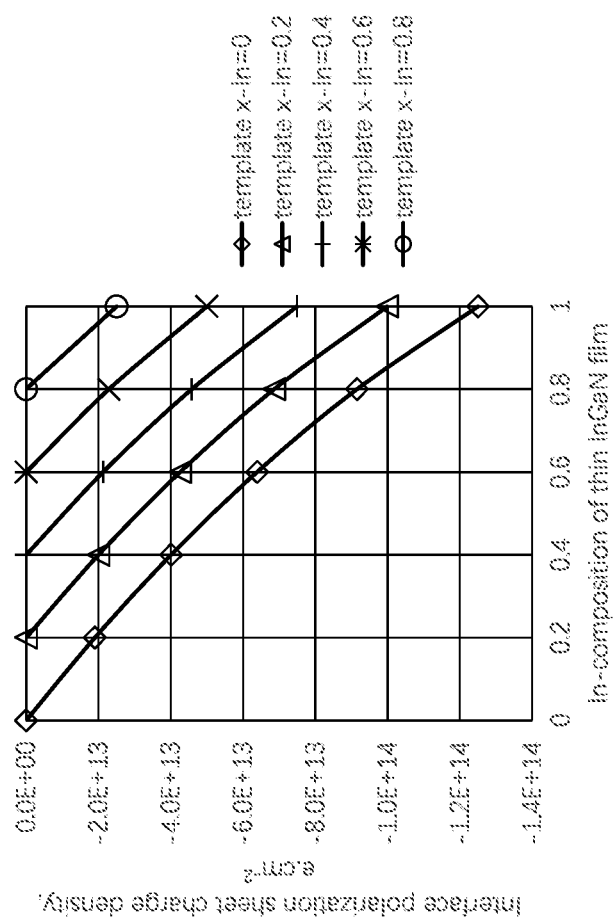
FIG. 6B plots the calculated polarization sheet charge densities for $In_xGa_{1-x}N$ thin films coherently grown on thick fully relaxed $In_yGa_{1-y}N$ template, wherein y≤x.
Figure 6C:
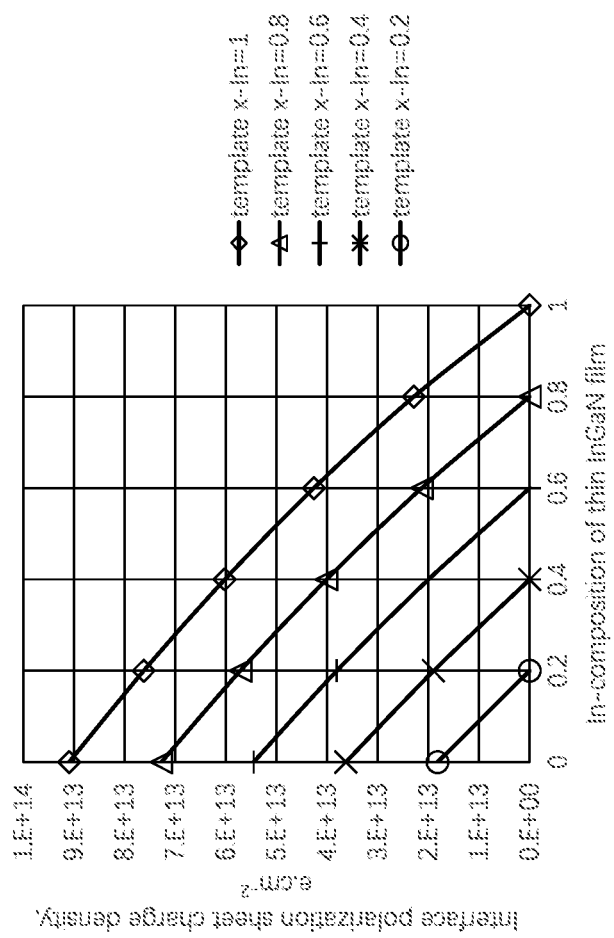
FIG. 6C plots the calculated polarization sheet charge densities for $In_xGa_{1-x}N$ thin films coherently grown on thick fully relaxed $In_yGa_{1-y}N$ template, wherein y≥x.

In FIG. 6B, where y≥x, meaning high-In-composition thin InGaN film is coherently formed on low-In-composition thick InGaN template, negative sheet charge is generated at the interface. In FIG. 6C, where y≤x, meaning low-In-composition thin InGaN film is coherently formed on high-In-composition thick InGaN template, positive sheet charge is generated at the interface. The interface sheet charge density can be approximately described by:

$$\sigma \cong -\left(\frac{y-x}{0.1}\right)10^{13} e \cdot cm^{-2} \quad \text{(eq. 9)}$$

where y and x being In-compositions of the thin InGaN film and the thick InGaN template, respectively.

With eqs. 6-9, it is possible to design better AlGaN/AlGaN, and InGaN/InGaN heterostructures for light-emitting devices.

Figure 7:
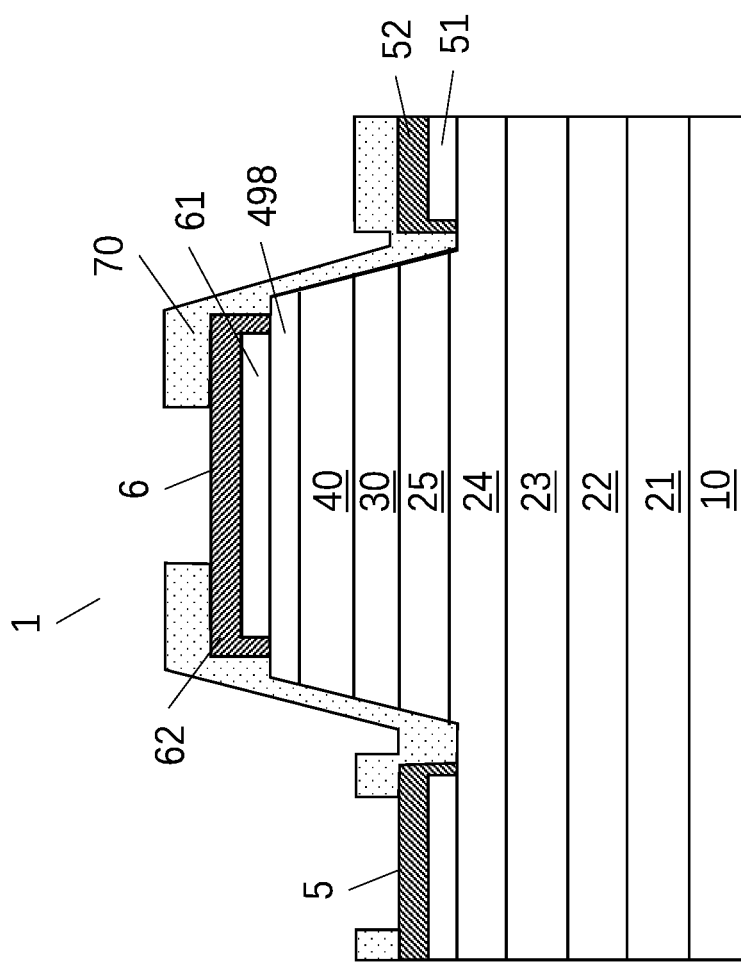
FIG. 7 illustrates a cross-sectional view of a LED according to an embodiment of the present invention.

Illustrated in FIG. 7 is a cross-sectional schematic view of a UV LED 1 according to another aspect of the present invention. The structure starts with a substrate 10, preferably being UV transparent and selected from sapphire, AlN, SiC, and the like. Formed over substrate 10 is a thin buffer layer 21, made of AlN or high-Al-composition AlGaN. A thick template 22 is subsequently formed on buffer 21. Template 22 can be made of a thick AlN or high-Al-composition AlGaN layer, for example, with a thickness of 0.3-4.0 μm. Even though not shown in FIG. 7, a strain management structure such as an Al-composition grading AlGaN layer or a few sets of AlN/AlGaN superlattices can be formed over template 22. Formed over template 22 is a thick n-AlGaN layer 23 for current spreading, made of Si or Ge doped AlGaN of thickness 2.0-5.0 μm (such as 3.0 μm) with dopant concentration from $2.0 \times 10^{18} - 5.0 \times 10^{18}$ $cm^{-3}$. A heavily n-type doped $N^+$—AlGaN heterostructure 24 is formed on n-AlGaN layer 23. Heterostructure 24 can be n-type doped to $8 \times 10^{18} - 2 \times 10^{19}$ $cm^{-3}$ and its design will be disclosed in details in the following contents. Formed on heterostructure 24 is a thin, lightly doped $N^-$—AlGaN layer 25 (0.1-0.5 μm such as 0.15 μm, n=$2.5 \times 10^{17} - 2 \times 10^{18}$ $cm^{-3}$), for reduction of current crowding and preparation of uniform current injection into the following $Al_bGa_{1-b}N/Al_wGa_{1-w}N$ MQW active-region 30. MQW 30 is made of alternatingly stacked n-$Al_bGa_{1-b}N$ barrier and $Al_wGa_{1-w}N$ well for a few times, for example, for 3-8 times. The barrier thickness is in the range of 8.0-16.0 nm, and the well thickness is 1.0-5.0 nm. The total thickness of MQW 30 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0 and 0.0-0.85, respectively, and the Al-composition difference of the barrier and adjacent well is at least 0.10, 0.15, 0.2, 0.25, or 0.3 (i.e., b−w≥0.10, 0.15, 0.2, 0.25, or 0.3), or so to ensure a barrier-well bandgap width difference ($\Delta E_g$) at least 270 meV to secure quantum confinement effect. More disclosure on MQW 30 will be provided in connection to FIGS. 17, 18A, 18B, 20, 21A, 21B and 21C. Following MQW 30 is a p-type AlGaN heterostructure 40, whose structure will be disclosed in details in the following contents. The general functionalities of heterostructure 40 include electron-blockage, hole supply and hole-injection. Formed on heterostructure 40 is another AlInGaN heterostructure 498, serving as a p-type contact layer. Heterostructure 498 will be disclosed in details in the following contents.

Also seen in FIG. 7, n-ohmic contact 51 is formed on the heavily n-type doped heterostructure 24. It can be made of thin metal layer stacks such as titanium/aluminum/titanium/gold (Ti/Al/Ti/Au) with respective layer thickness of 3-40/70-80/10-20/80-100 nm, for example 35/75/15/90 nm. It can also be made of thin vanadium/aluminum/vanadium/gold (V/Al/V/Au) with respective layer thickness of 3-80/70-150/10-50/20-800 nm, for example 20/100/20/60 nm. Formed on n-ohmic contact 51 is n-contact 52 and n-contact pad 5, made of thick metal layer such as 2-5 μm-thick gold layer. Similarly, p-ohmic contact 61 is formed on and in contact to heterostructure 498. The metal scheme of p-ohmic contact 61 will be disclosed in connection to the disclosure of heterostructure 498 in the following contents. Formed on p-ohmic contact 61 is p-contact 62 and p-contact pad 6, made of thick metal layer such as 2-5 μm-thick gold layer. The whole LED structure is then passivated by passivation layer 70, except for the n- and p-contact pads 5 and 6 (passivation layer 70 also covers the device sidewalls even though not explicitly shown in FIG. 7). Passivation layer 70 is preferably made of UV-transparent dielectric such as $SiO_2$, $Al_2O_3$, $AlF_3$, $CaF_2$, and $MgF_2$ et al.

Figure 8:
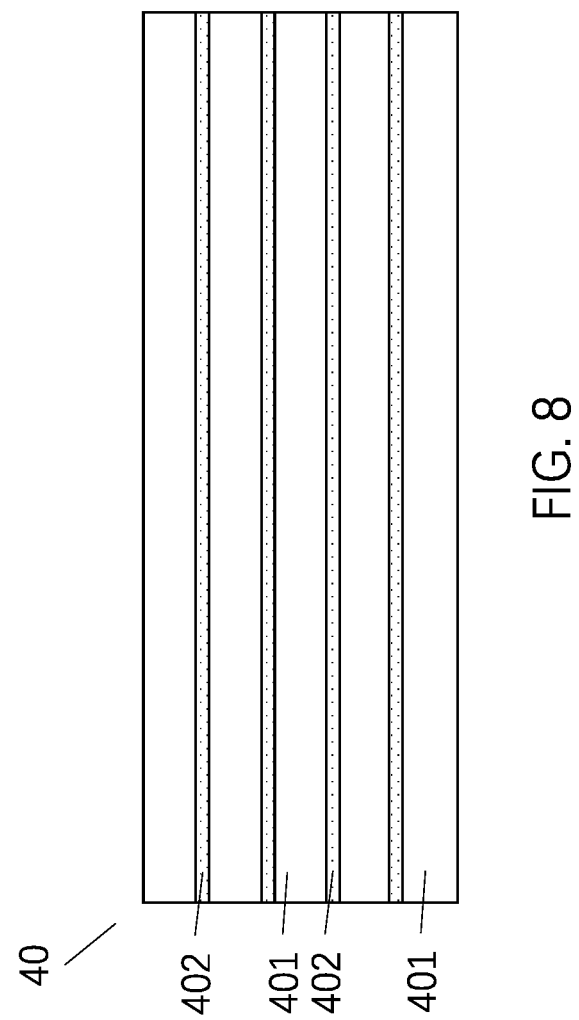
FIG. 8 illustrates a cross-sectional view of a p-type AlGaN structure according to an embodiment of the present invention.
Figures 9A, 9B:
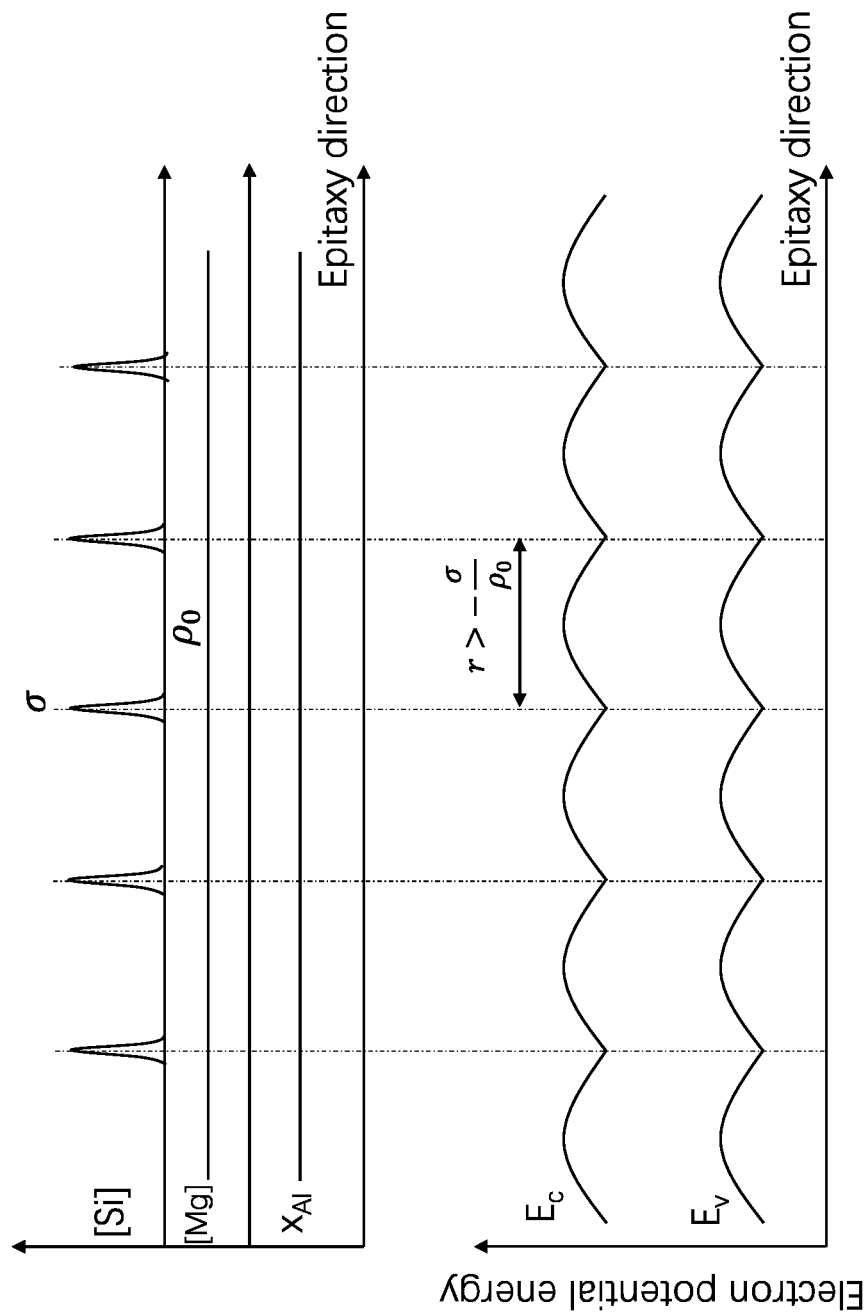
FIG. 9A illustrates one possible combination of dopant and composition profiles of the p-type AlGaN structure shown in FIG. 8.
FIG. 9B illustrates the band diagram of the p-type AlGaN structure shown in FIG. 9A.

Illustrated in FIG. 8 is a p-type AlGaN heterostructure 40 according to an embodiment of the present invention. In this embodiment, heterostructure 40 includes a Mg-doped AlGaN layer 401 inserted with multiple sheets 402 of positive charge. Sheets 402 of positive charge are formed via donor dopant delta doping (e.g., Si-delta doping). FIG. 9A illustrates a possible combination of dopant and composition profiles of heterostructure 40 shown in FIG. 8, where the Mg-doping and Al-composition of AlGaN layer 401 are constant, and the sheet charge density of sheets 402 is also constant. FIG. 9B illustrates the band diagram of the p-type AlGaN heterostructure 40 shown in FIG. 9A. In other embodiments, the Mg-doping and Al-composition may be not constant, i.e., they may change along epitaxial direction. For example, the Mg-doping and Al-composition may decrease or increase along epitaxial direction. Also, the sheet charge densities of different sheets 402 may be different.

Referring to FIG. 9B, the present invention requires that the distance between neighboring sheets 402 be larger than the maximal depletion depth ($L_{d0}$) given by eq. 5., i.e., $$> L_{d0} = -\frac{\sigma}{\rho_0},$$

where σ is the sheet charge density generated by Si-delta doping, taken to be the product of Si-delta doping sheet density and the elementary charge, and $\rho_0$ is the product of the acceptor doping concentration and electron's elementary charge ($\rho_0 = -eN_A$). This requirement ensures that neighboring depletion zones of neighboring sheets 402 do not overlap, and heterostructure 40 as a whole is not depleted. Also, the maximal depletion depth around sheet 402 is less than 10 nm, for example, less than 5 nm, or less than 2 nm, allowing for sufficient carrier tunneling or diffusion once an external bias is applied to heterostructure 40. These requirements set the design rules of heterostructure 40 for its bulk acceptor dopant concentration, sheet donor dopant density and sheet donor spatial arrangement.

Donor-delta doping density in heterostructure 40 is in the range of $1\times10^{11}$-$1\times10^{13}$ $cm^{-2}$, such as $5\times10^{11}$-$5\times10^{12}$ $cm^{-2}$, or equivalent. For example, it can be equivalent to a bulk doping concentration of $1\times10^{18}$-$1\times10^{20}$ $cm^{-3}$ for 1 nm thickness. Also, the more Mg-dopant concentration, the more Si-delta doping density is allowed in heterostructure 40, as long as the design rules set above are fulfilled. For example, referring to FIG. 4, if the depletion depth is allowed for 2 nm-thick, then a bulk Mg-doping level of $2\times10^{19}$ $cm^{-3}$ approximately allows for a maximal Si sheet density of $3.9\times10^{12}$ $cm^{-2}$ in sheets 402, and adjacent sheets 402 are to be placed more than 2 nm (e.g., 5 or 10 nm) apart from each other.

According to embodiments of the present invention, inserting sheets of positive charge (via donor delta-doping) into p-type heterostructure 40 can improve UV LED's reliability. It is well known that p-type dopant in group III nitrides can attract hydrogen atoms incorporation. These hydrogen atoms occupy interstitial sites of the nitride lattice and are often positive charged, i.e., becoming $H^+$. When a nitride LED is forward biased and in operation, the interstitial $H^+$ in p-type nitride can gain potential energy, which inevitably turns into kinetic energy and drives $H^+$ move towards the MQW active-region. Ions in the MQW active-region can scatter carriers and reduce radiative recombination probability, leading to light-output efficiency degradation. This situation worsens if the interstitial $H^+$ concentration is high, electric field is strong, and material quality is poor. These happen to be the exact cases for AlGaN based UV LEDs, as compared to GaN based visible LEDs. Inserting multiple sheets of positive charge into p-type nitride can slow down the electromigration of interstitial $H^+$ and improve LEDs' reliability.

The heterostructure 40 shown in FIG. 8 is one single p-type AlGaN layer inserted with one or more sheets of positive charge.

Heterostructure 40 may also contain more than one p-AlGaN layer inserted with multiple sheets of positive charge. Shown in FIG. 10 is a heterostructure 40 containing three Mg-doped AlGaN layers 403, 404, and 405, each is inserted with one or more sheets of positive charge (4032, 4042, and 4052) and the sheets of positive charge (4032, 4042, and 4052) divide each of the Mg-doped AlGaN layers 403, 404, and 405 into multiple zones (4031, 4041, and 4051), respectively. The thickness, composition, doping, and sheets of positive charge of AlGaN layers 403, 404, and 405 may be different from each other. For example, AlGaN layer 403 may be the thickest, of the highest Al-composition, and of the most sheets of positive charge if AlGaN layer 403 is the closest to MQW active-region 30. AlGaN layer 404 may be of the second or the third highest Al-composition among heterostructure 40. Each of AlGaN layers 403, 404 and 405, however, still follows the design rules outlined previously, i.e., distance between the neighboring sheets of positive charge should be larger than the maximal depletion depth, and the maximal depletion depth should be less than 10 nm, for example, less than 5 nm, or less than 2 nm.

Figure 11:
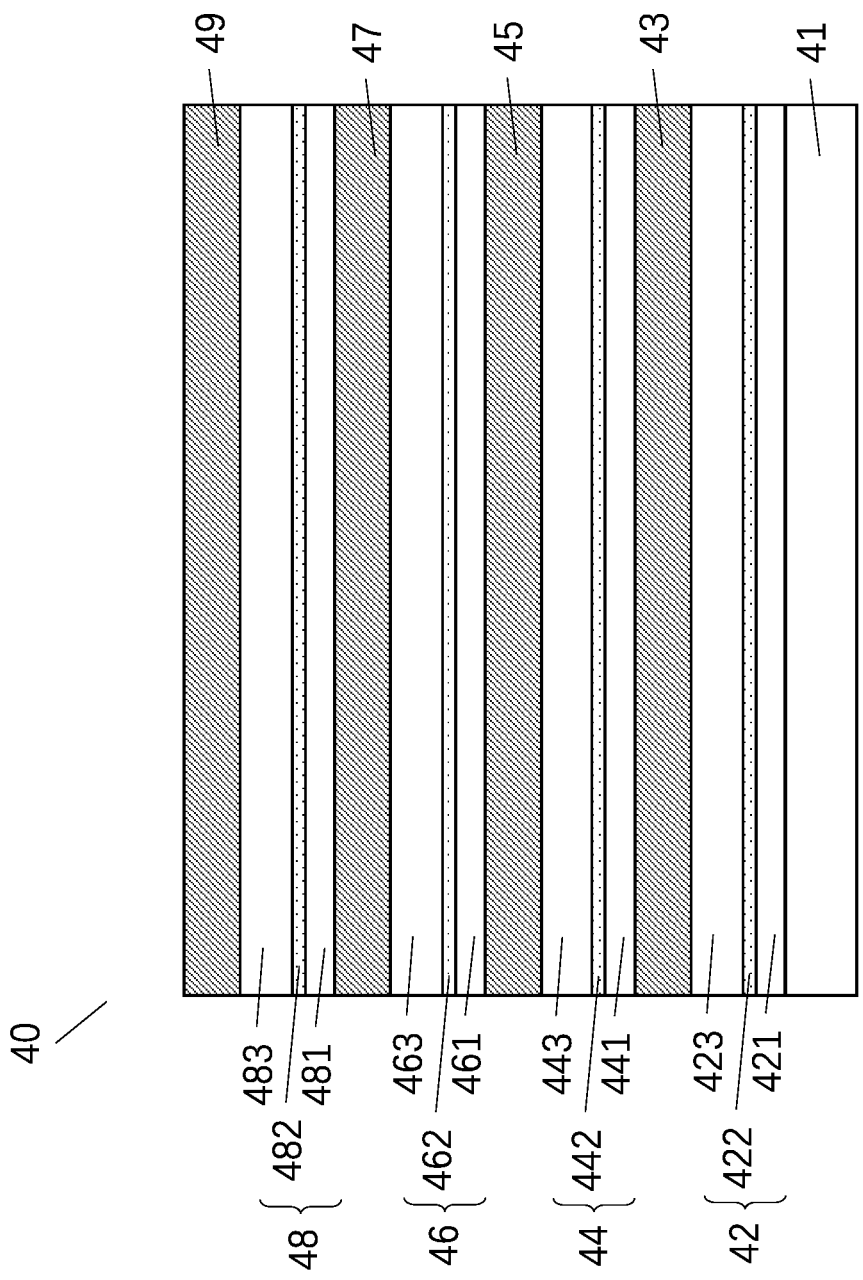
FIG. 11 illustrates a cross-sectional view of a p-type AlGaN heterostructure according to an embodiment of the present invention.

Illustrated in FIG. 11 is a p-type AlGaN heterostructure 40 according to another embodiment of the present invention, containing a Mg-doped high Al-composition AlGaN layer 41 which may have an Al-composition in the range of 0.6-0.8 and a thickness in the range of 1.0-5.0 nm, more than one Mg-doped AlGaN layers (42, 44, 46, and 48) inserted with at least one sheet of positive charge (422, 442, 462, and 482), and more than one Mg-doped AlGaN layers (43, 45, 47, and 49) separating AlGaN layers 42, 44, 46, and 48. The sheets of positive charge 422, 442, 462, and 482 divide the respective AlGaN layers (42, 44, 46, and 48) into a thinner prior zone (421, 441, 461, and 481) and a thicker post zone (423, 443, 463 and 483). In this embodiment, the Al-composition and Mg-doping may be constant within an AlGaN layer, however, the Al-composition and layer thickness of different AlGaN layers are generally different. In a special case, AlGaN layers 42-49 may form a periodic structure such as a superlattice, where layers 42, 44, 46, and 48 may be the barrier layers of a higher Al-composition (e.g., 0.60-0.85) and layers 43, 45, 47, and 49 may be the well layers of a lower Al-composition (e.g., 0.50-0.70), or vice versa. The sheet charge design rules outlined previously still hold for the sheets of positive charge 422, 442, 462, and 482, i.e., the distance between neighboring sheets of positive charge should be larger than the maximal depletion depth, and the maximal depletion depth should be less than 10 nm, for example, less than 5 nm, or less than 2 nm. Different AlGaN layers 42, 44, 46, and 48 may have the same or different Al-composition and thickness, and different AlGaN layers 43, 45, 47, and 49 may have the same or different Al-composition and thickness.

Figures 12A, 12B:
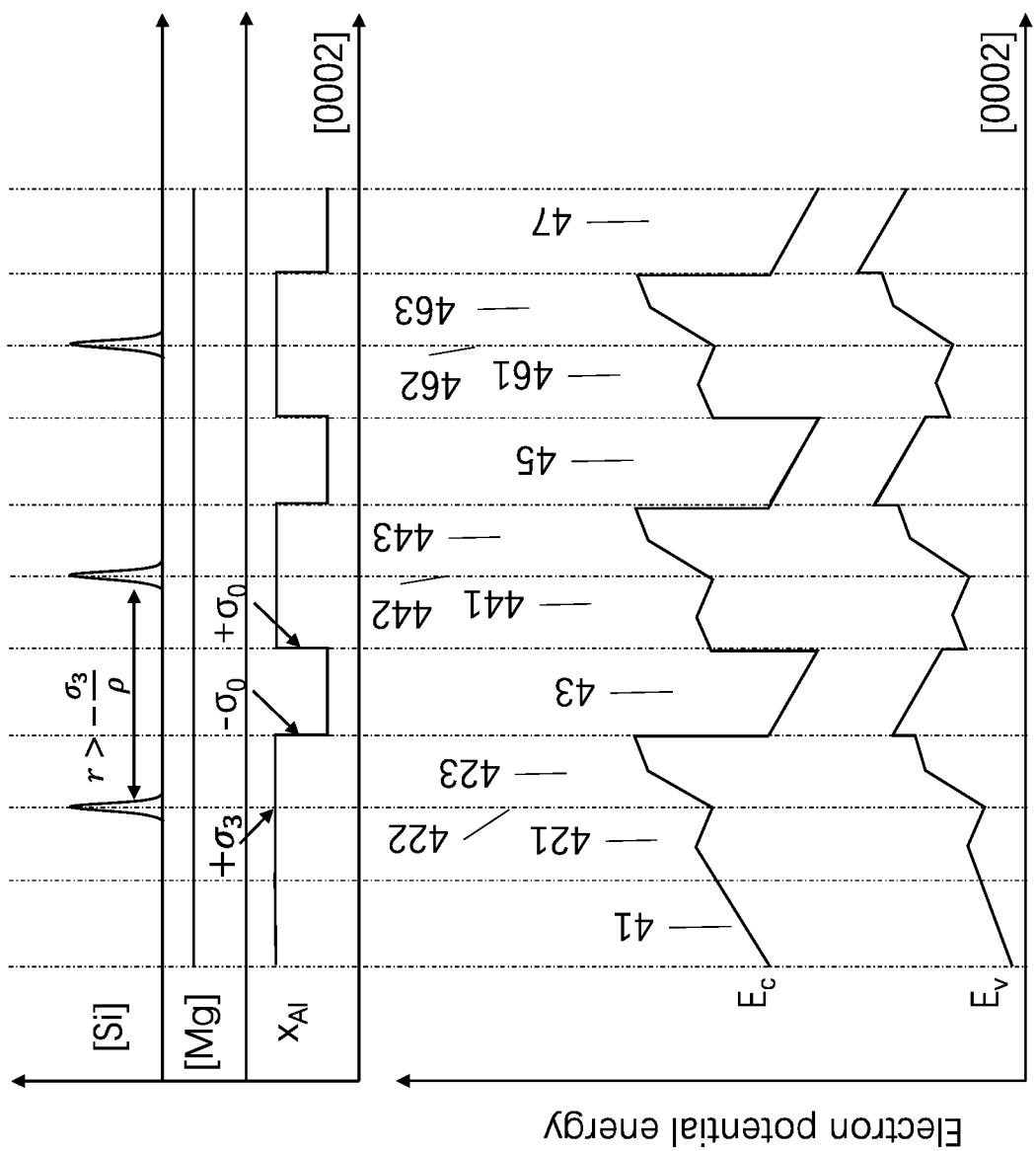
FIG. 12A illustrates one possible combination of dopant and composition profiles of the p-type AlGaN heterostructure shown in FIG. 11.
FIG. 12B illustrates the band diagram of the p-type AlGaN heterostructure shown in FIG. 12A.

FIG. 12A illustrates a possible combination of dopant and composition profiles of heterostructure 40 shown in FIG. 11, where the Mg-doping level is constant within heterostructure 40, and Al-compositions of AlGaN layers 42, 44, and 46 are higher forming barrier layers, and Al-compositions of AlGaN layers 43, 45, and 47 are lower forming well layers, and sheets of positive charge (422, 442, and 462) are located within the barrier layers. Besides the Si-delta-doping resulted sheets of positive charge ($\sigma_3$), there are also sheets of charge ($\sigma_0$, $-\sigma_0$) induced by polarization discontinuity at AlGaN barrier/well interfaces. FIG. 12B illustrates band diagram of the p-type AlGaN heterostructure 40 shown in FIG. 12A.

Figure 13:
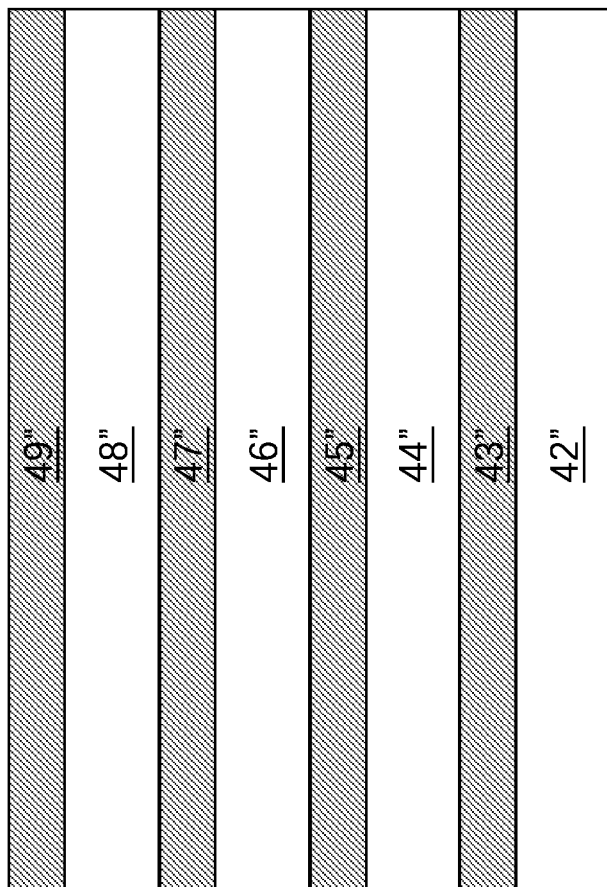
FIG. 13 illustrates a cross-sectional view of a p-type AlGaN heterostructure according to an embodiment of the present invention.

Illustrated in FIG. 13 is a p-type AlGaN heterostructure 40 according to another embodiment of the present invention, containing a Mg-doped Al-composition modulated AlGaN heterostructure. Specifically, it is formed by alternately stacking of AlGaN barriers (42", 44", 46" and 48") of an Al-composition in the range of 0.60-0.85 and AlGaN wells (43", 45", 47", and 49") of an Al-composition in the range of 0.50-0.70. Different AlGaN barriers may have the same or different Al-composition and thickness, and different AlGaN wells may have the same or different Al-composition and thickness. Here each of the barrier and each of the well may be of different Al-composition, doping concentration, and thickness. As discussed previously, for a heterostructure having many individual layers, each layer's thickness, doping and composition are not independent parameters, instead, they satisfy the inequality given by eq. 7 according to the present invention. Hence, the thickness of the $i^{th}$ barrier, $L_{Bi}$, satisfies:

$$L_{Bi} \leq -\frac{\sigma_{Bi}}{2\rho_{B0i}},$$

where $\sigma_{Bi}$, as a function of composition discontinuity (see eq. 8), is the sheet charge density on $i^{th}$ barrier's surface being oppositely charged in regard to the net activated dopant within $i^{th}$ barrier, and $\rho_{B0i}=eN_{BDi}-eN_{BAi}$ is the maximal charge density in the barrier depletion zone allowed by doping ($N_{BDi}$ and $N_{BAi}$ are the respective donor and acceptor concentrations of the $i^{th}$ barrier). And the thickness of the $j^{th}$ well, $L_{Wj}$, satisfies:

$$L_{Wj} \leq -\frac{\sigma_{Wj}}{2\rho_{W0j}},$$

where $\sigma_{Wj}$, as a function of composition discontinuity (see eq. 8), is the sheet charge density on $j^{th}$ well's surface being oppositely charged in regard to the net activated dopant within $j^{th}$ well, and $\rho_{W0j}=eN_{WDj}-eN_{WAj}$ is the maximal charge density in the well depletion zone allowed by doping ($N_{WDj}$ and $N_{WAj}$ are the respective donor and acceptor concentrations of the $j^{th}$ well).

A specific embodiment of AlGaN heterostructure 40 shown in FIG. 13 is an $Al_bGa_{1-b}N/Al_wGa_{1-w}N$ superlattice uniformly doped with Mg of concentration $N_A$ (cm$^{-3}$). Therefore, the barrier and well thicknesses according to eqs. 7 and 8 satisfy: $L_B$, $$L_W \leq \left(\frac{b-w}{0.2}\right)10^{13}\frac{1}{2N_A} \times 10^7 \text{ nm}.$$

For example, if b−w=0.2 and $N_A=10^{19}$ cm$^{-3}$, $L_B$, $L_W \leq 5$ nm; if b−w=0.4 and $N_A=2 \times 10^{19}$ cm$^{-3}$, $L_B$, $L_W \leq 5$ nm; et al.

Figures 14A, 14B:
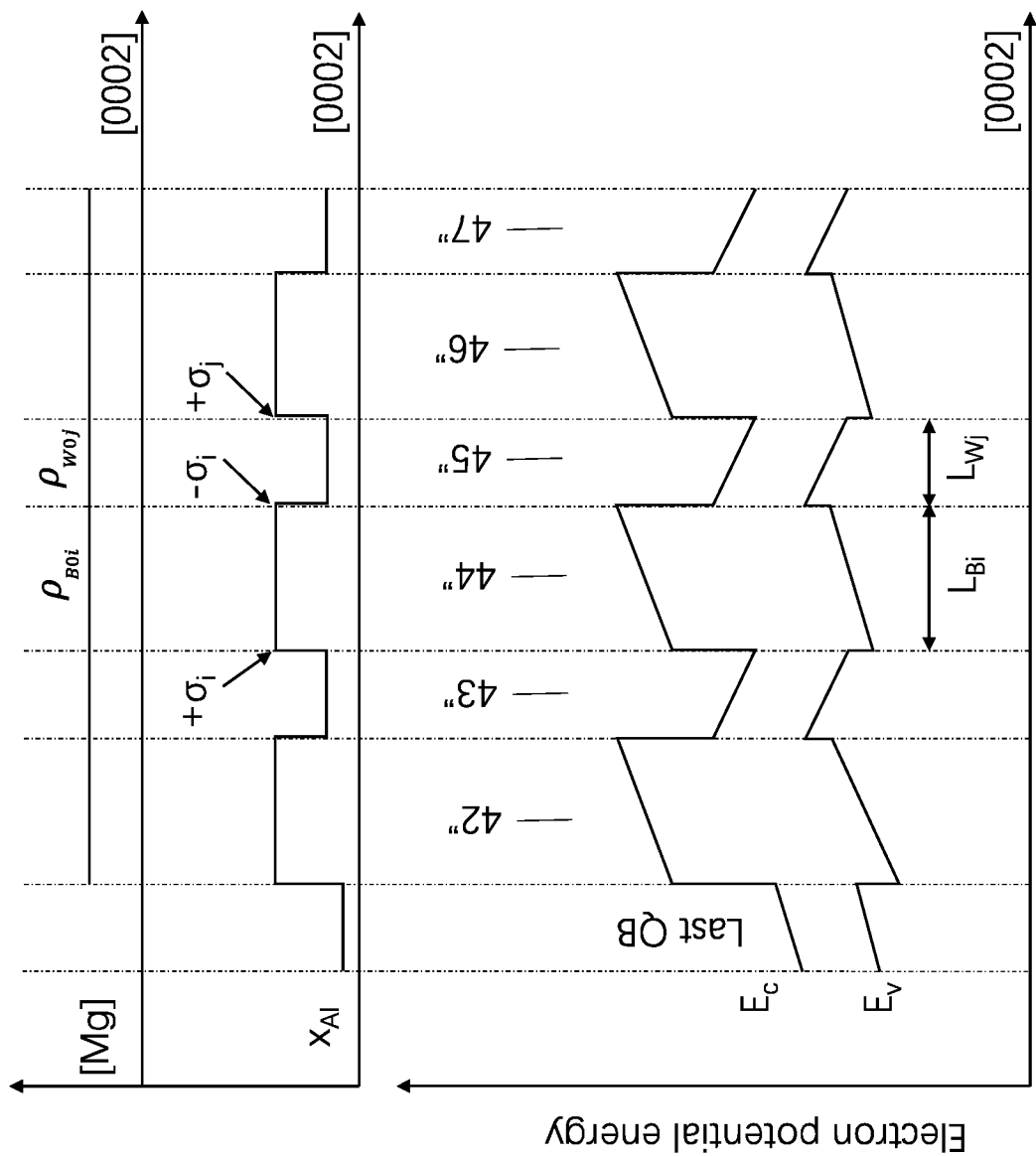
FIG. 14A illustrates one possible combination of dopant and composition profiles of the p-type AlGaN heterostructure shown in FIG. 13.
FIG. 14B illustrates the band diagram of the p-type AlGaN heterostructure shown in FIG. 14A.

FIG. 14A illustrates doping and composition profiles for a special, i.e., superlattice, embodiment of heterostructure 40 shown in FIG. 13, where the Mg doping may be constant or different for barriers and wells within heterostructure 40 (i.e., $\rho_{B0i}=\rho_{W0j}$, or $\rho_{B0i} \neq \rho_{W0j}$). FIG. 14B illustrates band diagram of the p-type AlGaN heterostructure 40 shown in FIG. 14A.

Since barrier layers of heterostructure 40 are tilted by polarization interface charge in a way impeding carriers' vertical transport, barrier layers can be thinner than well layers in cases where carrier vertical transport weighs more than quantum confinement.

Figure 15:
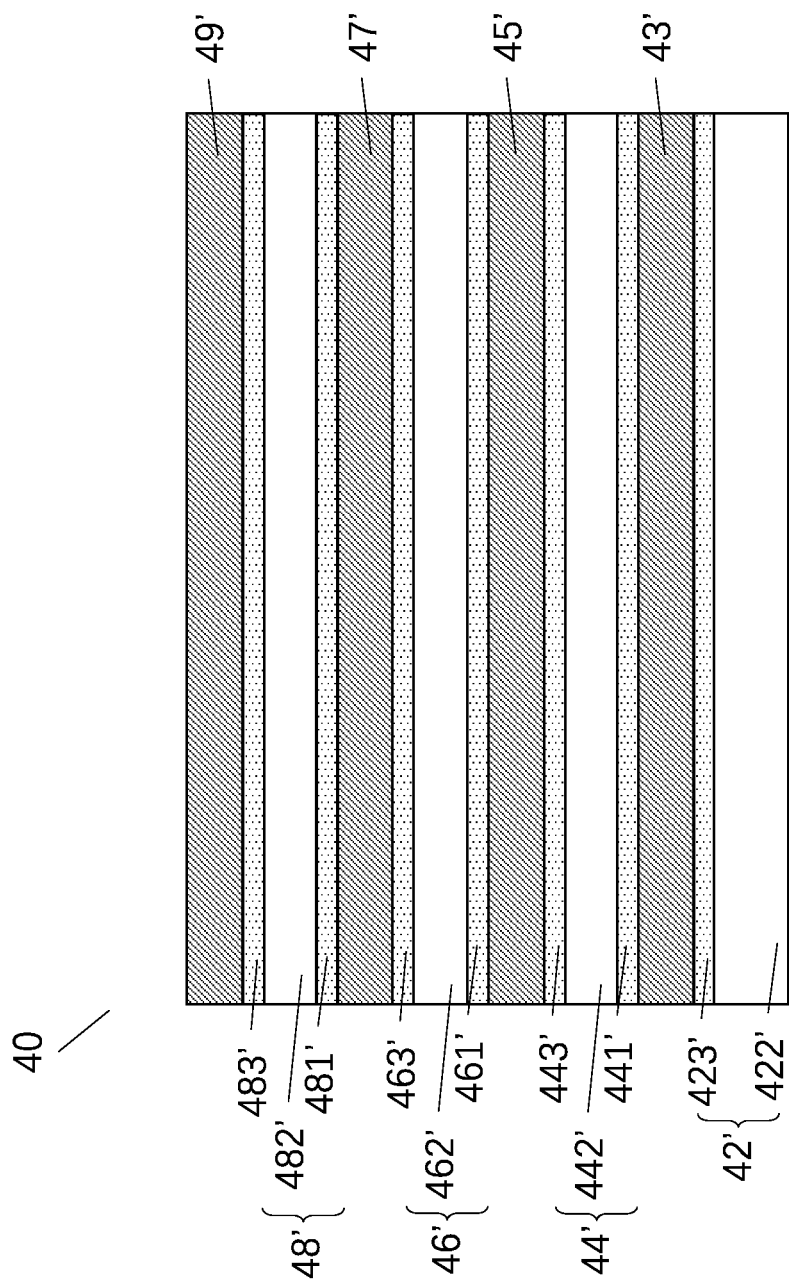
FIG. 15 illustrates a cross-sectional view of a p-type AlGaN heterostructure according to an embodiment of the present invention.

Illustrated in FIG. 15 is a p-type AlGaN heterostructure 40 according to another embodiment of the present invention. It differs from the embodiment shown in FIG. 13 in the barrier layers. The heterostructure 40 shown in FIG. 15 contains a first AlGaN barrier 42' and more than one AlGaN barriers (44', 46', 48' as shown). The first barrier 42', in contact with the last quantum barrier of the MQW active-region, contains a main barrier 422' and a post-barrier spacer 423'. The other barriers (44', 46', 48' as shown) respectively contain a main barrier and a prior-barrier spacer and a post-barrier spacer. For example, the second barrier 44' contains a main barrier 442' and a prior-barrier spacer 441' and a post-barrier spacer 443', the third barrier 46' contains a main barrier 462' and a prior-barrier spacer 461' and a post-barrier spacer 463', etc. A post-barrier spacer is in contact with its main barrier and its following well, a prior-barrier spacer is in contact with its precedent well and its main barrier. For example, post-barrier spacer 423' is in contact with its main barrier 422' and its following well 43'; prior-barrier spacer 441' is in contact with its precedent well 43' and its main barrier 442'; post-barrier spacer 443' is in contact with its main barrier 442' and its following well 45', etc.

The post- and prior-barrier spacers are made of p-type AlGaN with different Al-compositions than those of the main barrier and well, so that the main barrier and well can have different interface sheet charge densities, allowing for more flexibility of designing heterostructure 40. Post- and prior-barrier spacers are thinner than the main barrier and well. Post- and prior-barrier spacers may be of the same composition or of different composition. Thickness of post- and prior-barrier spacers are optionally in the range of 0.1 nm to 1.5 nm, such as 0.5 nm to 1.2 nm, respectively. Al-composition of the post- and prior-barrier spacer can be in the range of 0.0-1.0, such as 0.10-0.95, respectively. Al-composition of the main barrier can be in the range of 0.60-0.85.

Figures 16A, 16B:
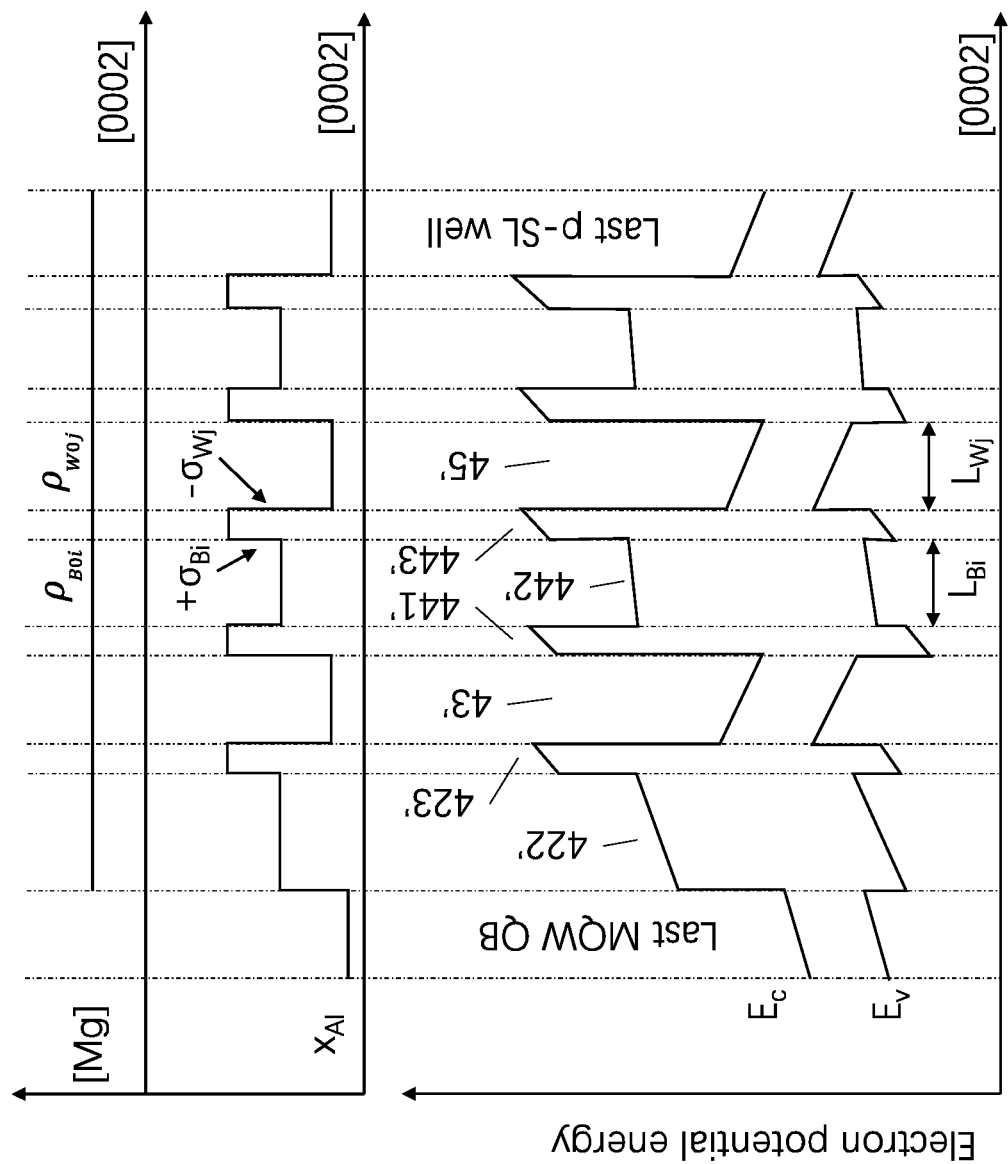
FIG. 16A illustrates one possible combination of dopant and composition profiles of the p-type AlGaN heterostructure shown in FIG. 15.
FIG. 16B illustrates the band diagram of the p-type AlGaN heterostructure shown in FIG. 16A.

In an embodiment, the post- and prior-barrier spacers are of higher Al-composition than their main barrier. A combination of doping and composition profiles of this embodiment is illustrated in FIG. 16A, with its band diagram illustrated in FIG. 16B. As seen, in this embodiment, the $j^{th}$ well is subjected to interface charge density $\sigma_{Wj}$, which is larger than $\sigma_{Bi}$, the interface charge density experienced by $i^{th}$ main barrier. This is true because the Al-composition difference between the spacer and well is larger than that between the spacer and main barrier, and according to eq. 8, this will generate more sheet charge on the well-spacer interface. In this embodiment, Mg acceptors in the wells will have higher probability to activate. In one embodiment according to this aspect of the present invention, post- and prior-barrier spacers are made of 0.26-0.52 nm-thick AlN layer, respectively. AlN post- and prior-barrier spacers enhances electron blocking capability hence improves LED's reliability.

In another embodiment, the post- and prior-barrier spacers are of lower Al-composition (such as 0.0-0.6, or 0.2-0.4) than adjacent wells (such as 0.5-0.7). A combination of doping and composition profiles of this embodiment is illustrated in FIG. 16C (band diagram not shown here). In this embodiment, the $j^{th}$ well is subjected to interface charge density $\sigma_{Wj}$, which is smaller than $\sigma_{Bi}$, the interface charge density experienced by $i^{th}$ main barrier. This is true according to eq. 8, because the Al-composition difference between the spacer and main barrier is larger than that between the spacer and well. In this embodiment, Mg acceptors in the main barriers will have higher probability to activate. In one embodiment according to this aspect of the present invention, post- and prior barrier spacers are made of 0.1-0.52, such as 0.2-0.4 nm-thick GaN layer, respectively. GaN post- and prior-barrier spacers enhances hole concentration within AlGaN structure 40, hence improves LED's internal quantum efficiency.

In still another embodiment according to this aspect of the present invention, at least a post- and/or prior-barrier spacer is made of AlGaN thin layer with Al-composition higher than the main barrier, while at least a post- and/or prior-barrier spacer is made of AlGaN thin layer with Al-composition less than the well. A combination of doping and composition profiles of this embodiment is illustrated in FIG. 16D. Optionally, at least one post- and/or prior-barrier spacer is made of AlN and at least one post- and/or prior-barrier spacer is made of GaN, with thickness in the range of 0.1-0.52 nm. Optionally, the at least AlN spacer is placed closer to MQW 30 than the at least GaN spacer.

The thicknesses of the well and main barrier of the above embodiments may still obey eq. 7.

Figures 19A, 19B:
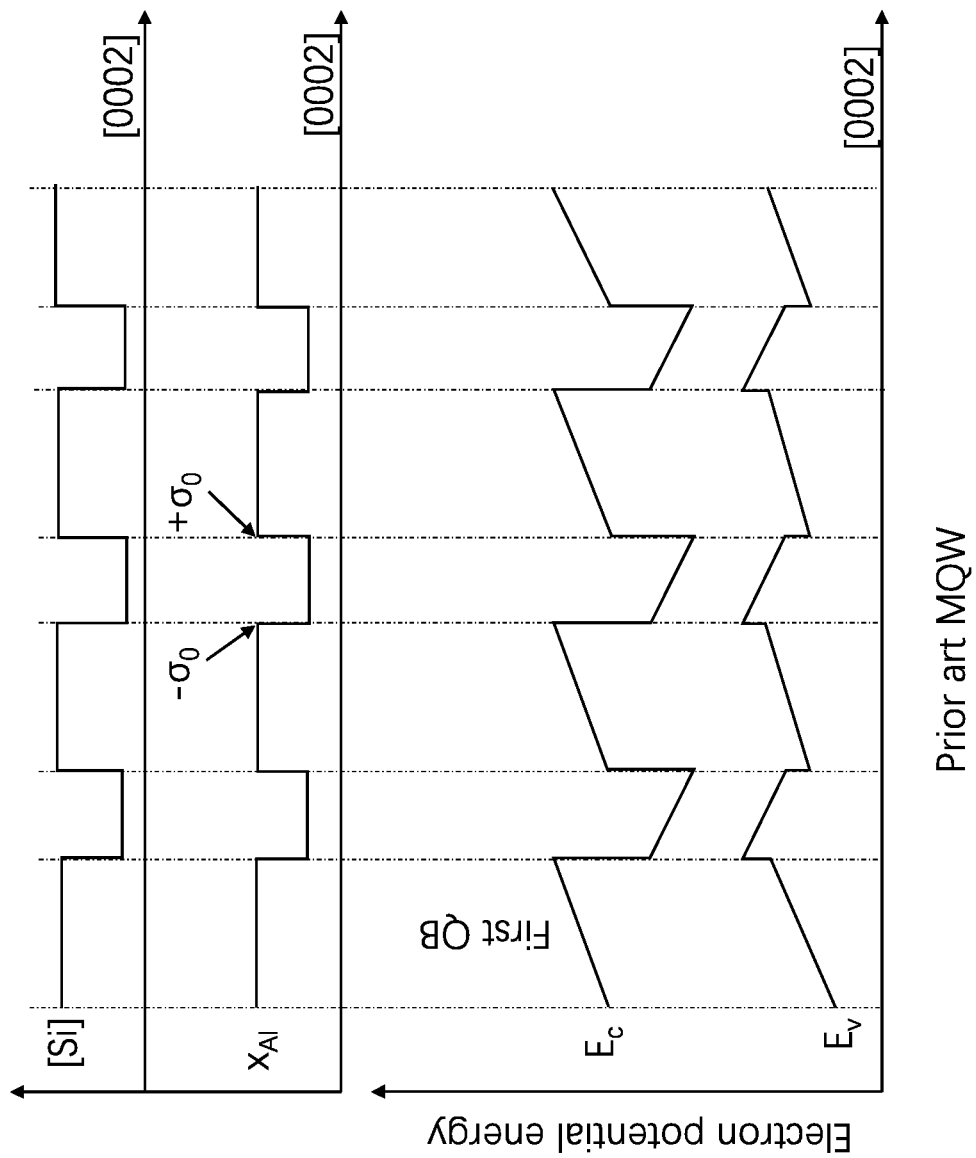
FIG. 19A illustrates dopant and composition profiles of a prior art AlGaN/AlGaN MQW.
FIG. 19B illustrates the band diagram of the prior art AlGaN/AlGaN MQW shown in FIG. 19A.

MQW active-region is a special AlGaN heterostructure. The doping and composition profiles of a prior art AlGaN MQW are illustrated in FIG. 19A, together with the band diagram illustrated in FIG. 19B. As seen, the interface polarization sheet charge $\sigma_0$ tilts the quantum well band edge, spatially separating injected electrons and holes and resulting in inferior light-emitting efficiency. The interface polarization sheet charge also tilts band edge of the quantum barriers, resulting in increased impedance for electron and hole injection.

Figure 17:
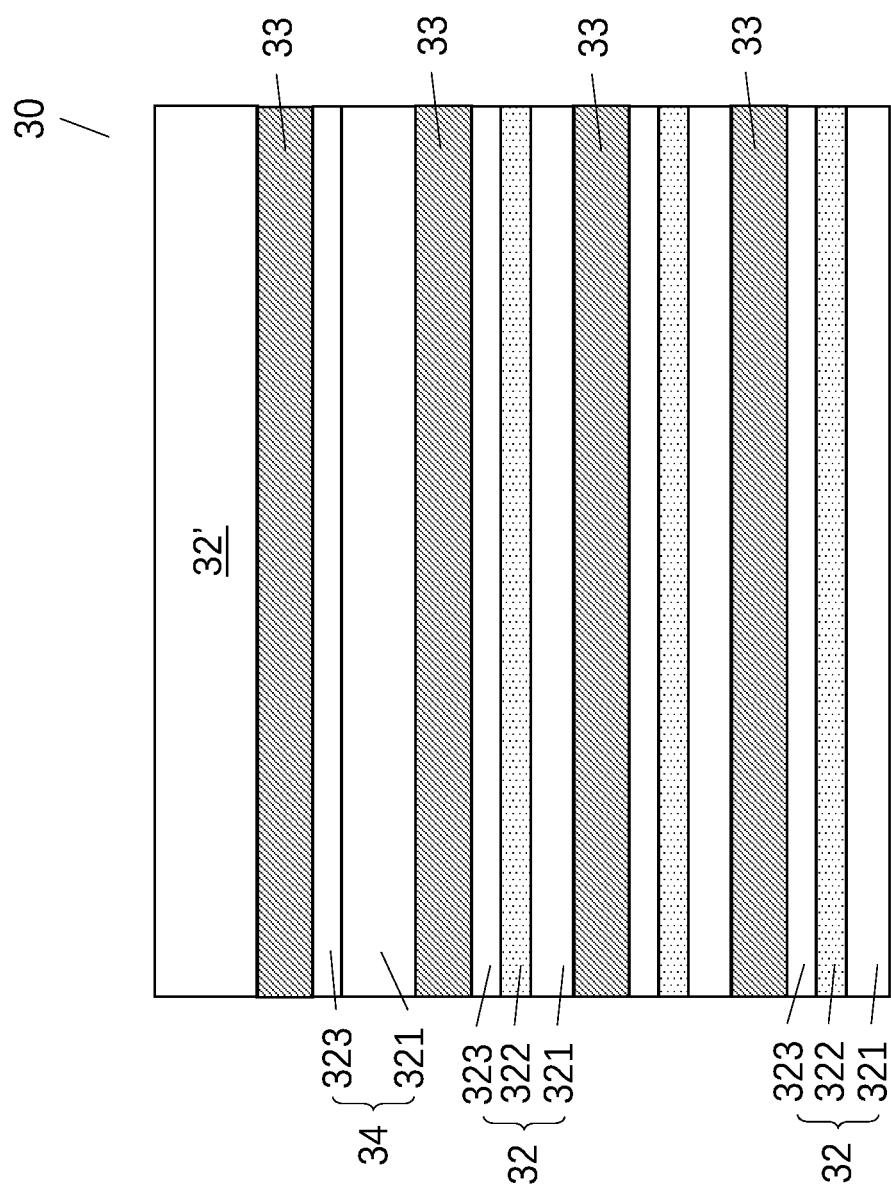
FIG. 17 illustrates a cross-sectional view of an MQW structure according to an embodiment of the present invention.
Figures 18A, 18B:
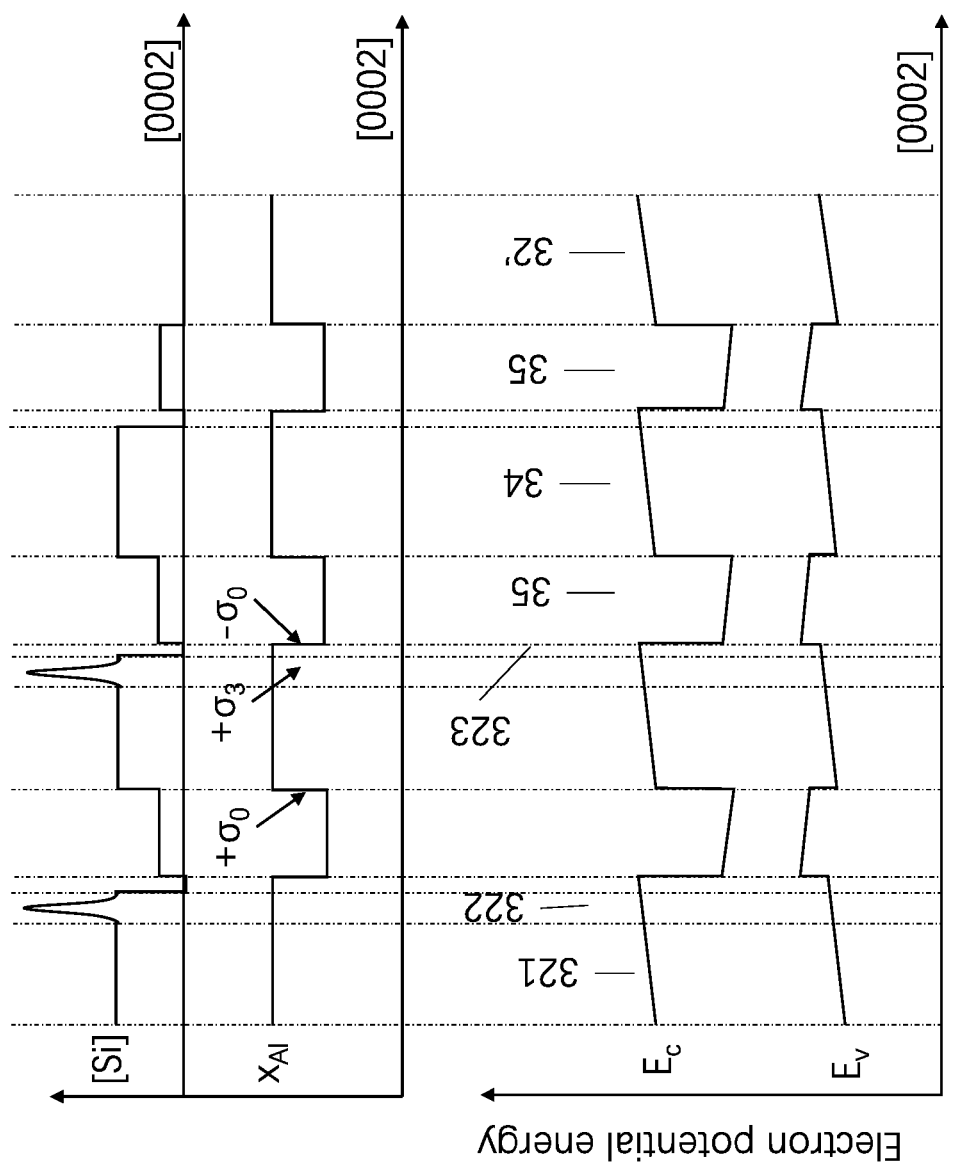
FIG. 18A illustrates one possible combination of dopant and composition profiles of the MQW structure shown in FIG. 17.
FIG. 18B illustrates the band diagram of the MQW structure shown in FIG. 18A.

Another aspect of the present invention provides an MQW 30, as illustrated in FIG. 17. MQW 30 contains at least one quantum well (QW) 33, being undoped or lightly Si-doped (e.g., $1.0\text{-}5.0\times10^{17}$ cm$^{-3}$), and at least one first quantum barrier (QB) 32, one second last QB 34 formed on the first QB 32 and one last QB 32' formed on the second QB 34. The last QB 32' is undoped, and is in contact with the last QW 33 on one side and the p-AlGaN heterostructure 40 (or other suitable p-AlGaN layer or structure) on the other side. First QB 32 contains a uniform Si-doped (n=$1.0\text{-}8.0\times10^{18}$ cm$^{-3}$) layer 321, a Si-delta doped sheet 322, and an undoped layer 323. The second last QB 34 contains a uniform Si-doped (n=$1.0\text{-}8.0\times10^{18}$ cm$^{-3}$) layer 321 and an undoped layer 323. Layers 321 and 323 are 6-10 nm and 2-4 nm thick, respectively. The doping and composition profiles of a MQW 30 according to an embodiment of the present invention are illustrated in FIG. 18A, and the band diagram is shown in FIG. 18B. Suppose the thickness of layer 321 is t, with a Si doping concentration $N_D$, and the Si-delta doping sheet charge density is $\sigma_3$, and the QB/QW interface polarization sheet charge density is $\sigma_0$, then eq. 10 holds.

$$\sigma_3=\sigma_0-eN_Dt \quad\quad\quad (eq.\ 10)$$

In one embodiment, QB 32 and QW 33 are of an Al-composition difference of 0.1 (b−w=0.1, then $\sigma_0$=5×10$^{12}$ e·cm$^{-2}$ using eq. 8), and layer 321 is 8 nm-thick doped with $N_D$=5×10$^{18}$ cm$^{-3}$. According to eq. 10 of the present invention, a Si-delta doping sheet charge density $\sigma_3$=10$^{12}$ e·cm$^{-2}$ is preferred. As Si is a rather shallow donor in AlGaN, in an embodiment of the present invention, Si-delta doping density in layer 322 then is 10$^{12}$ cm$^{-2}$.

In another embodiment, QB 32 and QW 33 are of Al-composition difference of 0.15 (b−w=0.15, then $\sigma_0$=7.5×10$^{12}$ e·cm$^{-2}$ using eq. 8), and layer 321 is 8 nm-thick doped with $N_D$=5×10$^{18}$ cm$^{-3}$. According to eq. 10 of the present invention, a Si-delta doping sheet charge density $\sigma_3$=3.5×10$^{12}$ e·cm$^{-2}$ is preferred. As Si is a rather shallow donor in AlGaN, the present invention requires Si-delta doping density in layer 322 then to be 3.5×10$^{12}$ cm$^{-2}$.

In still another embodiment, QB 32 and QW 33 are of Al-composition difference of 0.2 (b−w=0.2, then $\sigma_0$=1.0×10$^{13}$ e·cm$^{-2}$ using eq. 8), and layer 321 is 10 nm-thick doped with $N_D$=5×10$^{18}$ cm$^{-3}$. According to eq. 10 of the present invention, a Si-delta doping sheet charge density $\sigma_3$=5.0×10$^{12}$ e·cm$^{-2}$ is preferred. As Si is a rather shallow donor in AlGaN, the present invention requires Si-delta doping density in layer 322 then to be 5.0×10$^{12}$ cm$^{-2}$.

The Al-composition of QW 33, last QB 32', layer 321, and layer 323 can be in the range of 0.35-0.55, 0.55-0.65, 0.55-0.65, and 0.55-0.65, respectively.

The MQW active-regions designed according to this aspect of the present invention possess higher light-generation efficiency and lower device operation voltage.

Figure 20:
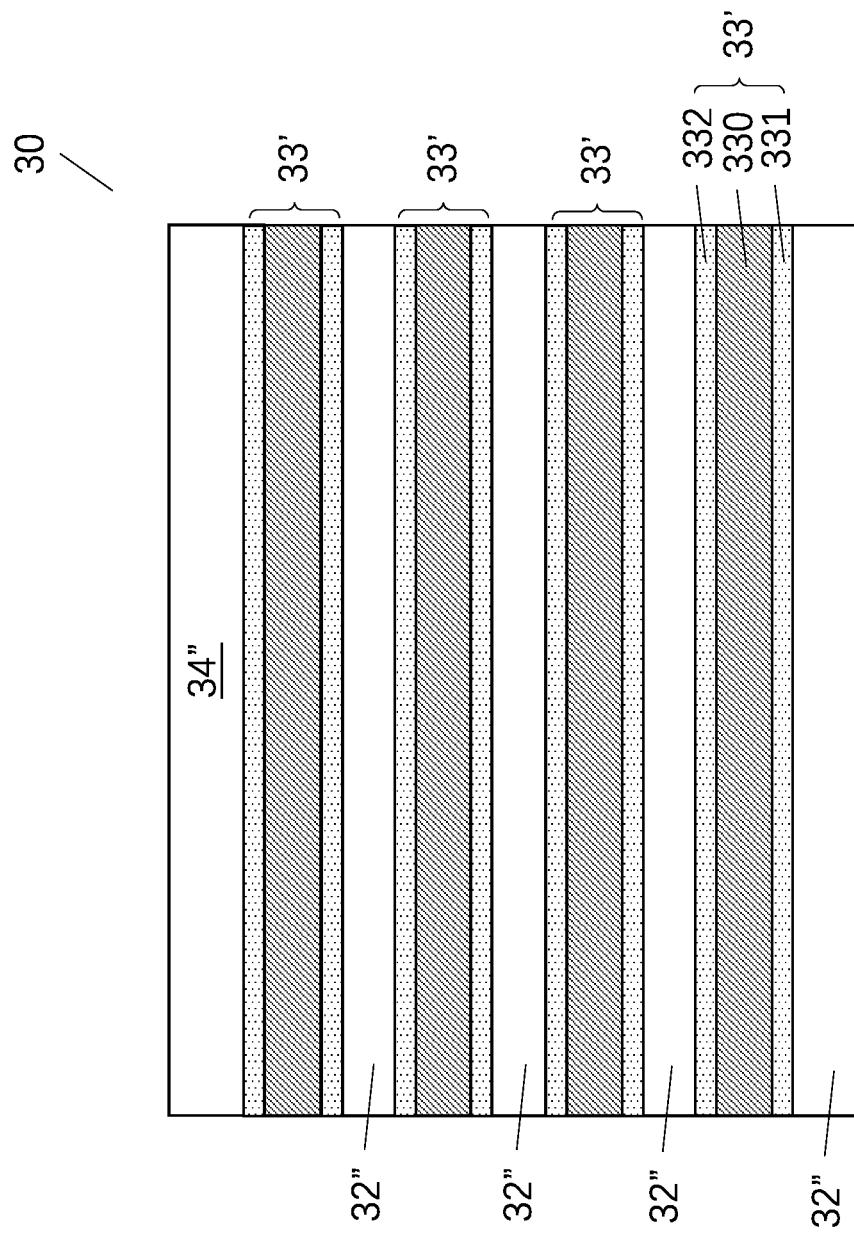
FIG. 20 illustrates a cross-sectional view of an MQW structure according to an embodiment of the present invention.
Figure 21C:
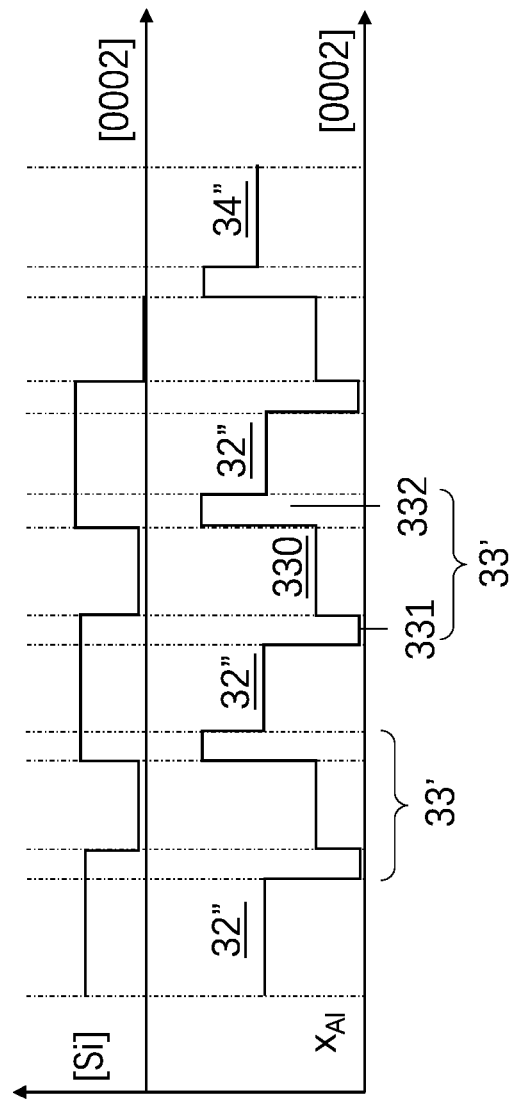
FIG. 21C illustrates one possible combination of dopant and composition profiles of the MQW 30 shown in FIG. 20.

Illustrated in FIG. 20 is another embodiment of MQW 30 according to this aspect of the present invention, containing at least a first QB 32" and a last QB 34" and a QW 33' including a main QW 330 sandwiched by a prior-QW spacer 331 and a post-QW spacer 332. Some doping and composition profiles of MQW 30 are illustrated in FIGS. 21A-21C. As seen, all the first QBs 32", prior- and post-QW spacers 331 and 332 are uniformly doped with Si (n=$1.0\text{-}8.0\times10^{18}$ cm$^{-3}$), all the main QWs 330 can be undoped or doped with Si less than $5.0 \times 10^{17}$ cm$^{-3}$, and the last QB 34'' is undoped. A post-QW spacer is in contact with its precedent main QW 330 and its following QB, a prior-QW spacer is in contact with its precedent QB and its following main QW.

The post- and prior-QW spacers are made of n-type AlGaN with different Al-compositions than those of the QBs and the main QWs, so that the QB and the main QW can have different interface sheet charge densities, allowing for more flexibility of designing MQW 30. Post- and prior-QW spacers are thinner than the main QW and QB. Post- and prior-QW spacers may be of the same composition or of different composition. Thickness of post- and prior-QW spacers are optionally in the range of 0.1 nm to 0.52 nm.

In one embodiment, the post- and prior-QW spacers are of higher Al-composition than the QB. A combination of doping and composition profiles of this embodiment is illustrated in FIG. 21A. In one embodiment according to this aspect of the present invention, post- and prior-QW spacers are made of 0.1-0.52 nm-thick AlN layer.

In another embodiment, the post- and prior-QW spacers are of lower Al-composition than the well. A combination of doping and composition profiles of this embodiment is illustrated in FIG. 21B. In one embodiment according to this aspect of the present invention, post- and prior-QW spacers are made of 0.1-0.52 nm-thick GaN layer.

In still another embodiment according to this aspect of the present invention, at least a post- and/or prior-QW spacer is made of AlGaN thin layer with Al-composition higher than the QB, while at least a post- and/or prior-QW spacer is made of AlGaN thin layer with Al-composition less than the main QW. A combination of doping and composition profiles of this embodiment is illustrated in FIG. 21C. Optionally, at least one thin AlGaN spacer is made of AlN and at least one thin AlGaN spacer is made of GaN, with thickness in the range of 0.1-0.52 nm.

The Al-composition of first QB 32'', last QB 34'', a main QW 330, prior-QW spacer 331 and post-QW spacer 332 can be in the range of 0.55-0.65, 0.55-0.65, 0.35-0.55, 0.0-1.0, and 0.0-1.0, respectively.

The MQW active-regions designed according to this aspect of the present invention possess high light-generation efficiency and low optical power decay with time.

Figure 22:
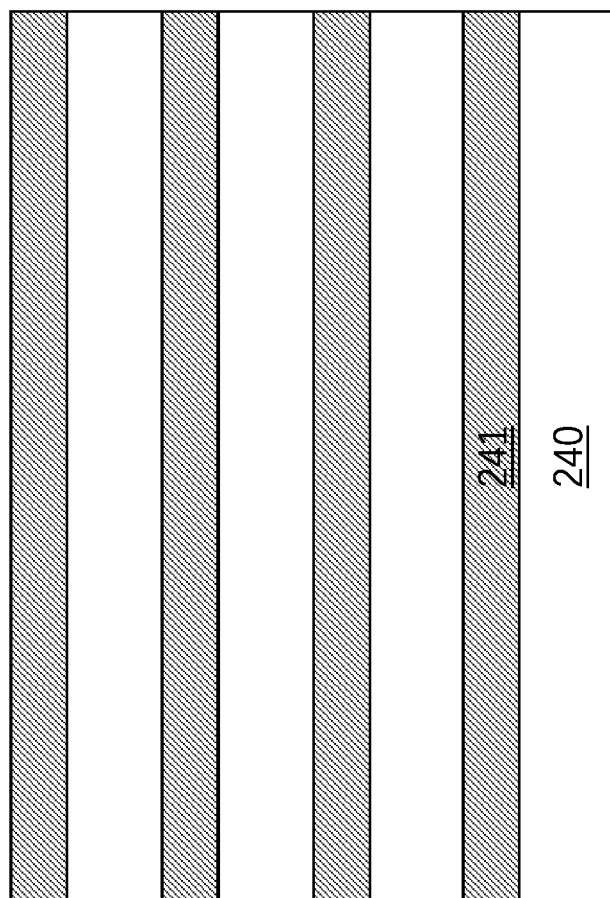
FIG. 22 illustrates a cross-sectional view of an n-type AlGaN heterostructure according to an embodiment of the present invention.

Illustrated in FIG. 22 is an N$^+$-type AlGaN heterostructure 24 according to an embodiment of another aspect of the present invention, containing a heavily Si-doped Al-composition modulated AlGaN heterostructure. In general, heterostructure 24 can be formed by multiple AlGaN layers of different Al-composition and thickness, all heavily doped with Si to $8.0 \times 10^{18}$-$2.0 \times 10^{19}$ cm$^{-3}$. The doping and thickness of each individual layer obey eq. 7, similarly to the discussions given above in connection to FIGS. 2 and 13.

A superlattice embodiment of N$^+$-type AlGaN heterostructure 24 can be formed by alternately stacking of $Al_bGa_{1-b}N$ barrier 240 and $Al_wGa_{1-w}N$ well 241 for multiple times, uniformly doped with Si of concentration $N_D$ (cm$^{-3}$). Therefore, the barrier and well thicknesses according to eqs. 7 and 8 satisfy:

$$L_B; L_W \leq \left(\frac{b-w}{0.2}\right) 10^{13} \frac{1}{2N_D} \times 10^7 \text{ nm}.$$

For example, if b−w=0.2 and $N_D = 10^{19}$ cm$^{-3}$, $L_B$, $L_W \leq 5$ nm; if b−w=0.2 and $N_D = 8 \times 10^{18}$ cm$^{-3}$, $L_B$, $L_W \leq 6.25$ nm; et al.

Figures 23A, 23B:
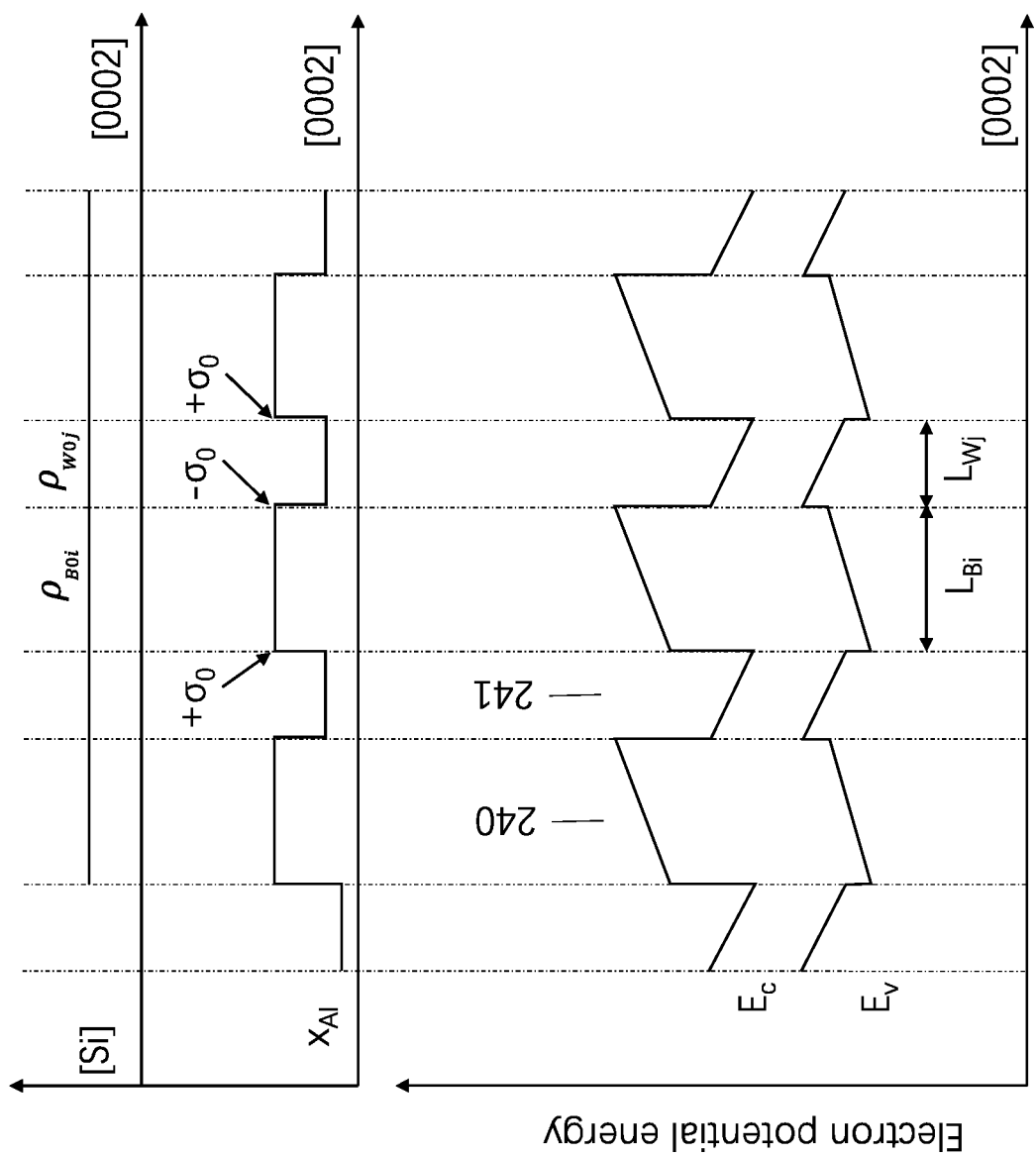
FIG. 23A illustrates one possible combination of dopant and composition profiles of the n-type AlGaN heterostructure shown in FIG. 20.
FIG. 23B illustrates the band diagram of the n-type AlGaN heterostructure shown in FIG. 21A.

FIG. 23A illustrates a superlattice embodiment of heterostructure 24 shown in FIG. 22, where the Si-doping level is constant within heterostructure 24. FIG. 23B illustrates band diagram of the AlGaN heterostructure 24 shown in FIG. 23A.

Figure 24:
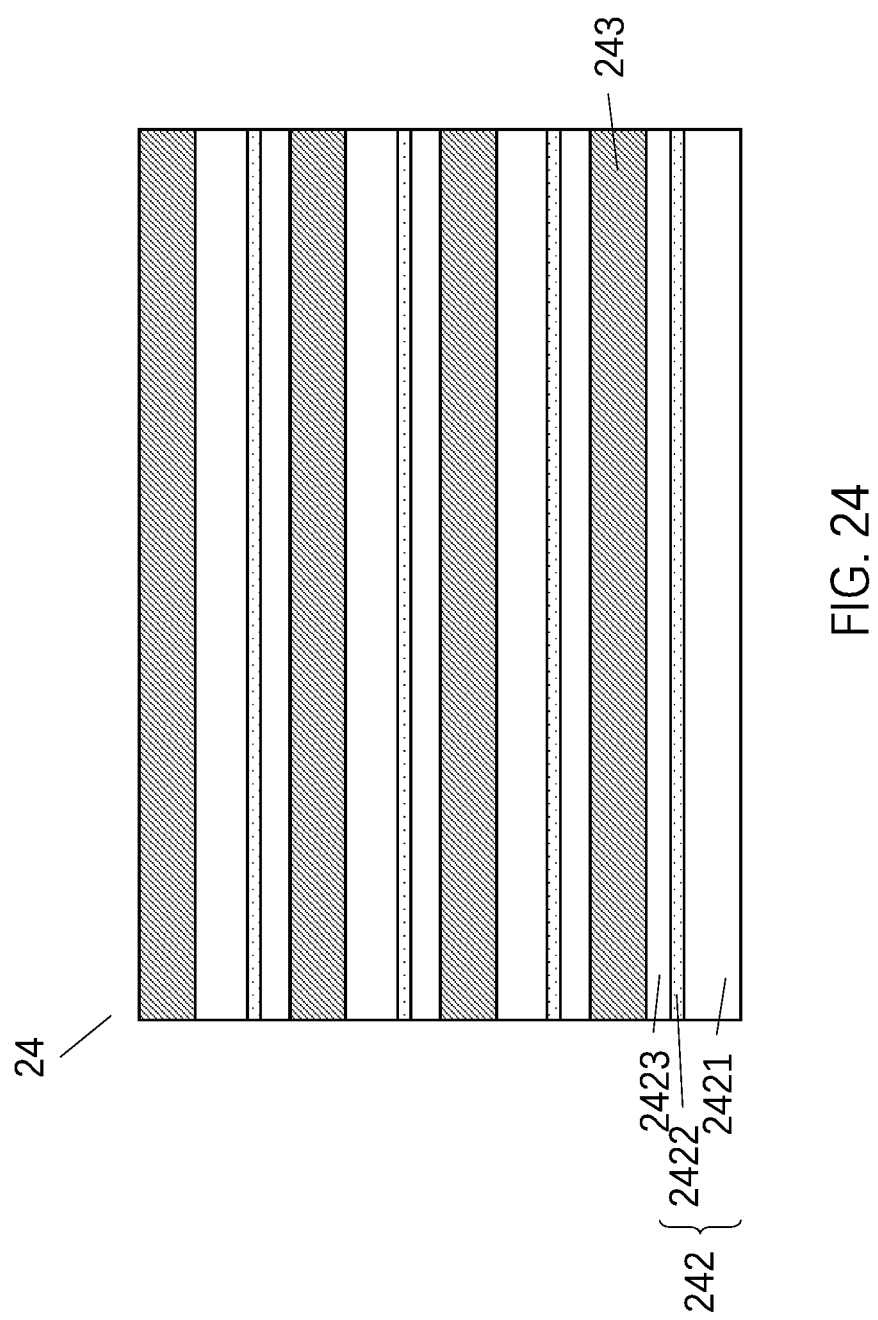
FIG. 24 illustrates a cross-sectional view of an n-type AlGaN heterostructure according to an embodiment of the present invention.

FIG. 24 illustrates another superlattice embodiment of heterostructure 24, made of alternately stacking of barrier 242 and well 243 for multiple times, where barriers 242 contain a Si-delta doped zone 2422.

Since barrier layers of heterostructure 24 are tilted by polarization interface charge in a way impeding electrons' vertical transport, the barrier layers can be thinner than the well layers in heterostructure 24 where carrier vertical transport weighs more than quantum confinement.

Similar to the embodiment shown in FIG. 15, optionally, there may be prior- and post-barrier spacers before and after barrier 240 and 242 (not explicitly shown in FIGS. 22 and 24). The post- and prior-barrier spacers are made of n-type AlGaN with different Al-compositions than those of the barrier and well, so that the barrier and well can have different interface sheet charge densities, allowing for more flexibility of designing heterostructure 24. Post- and prior-barrier spacers are thinner than the barrier and well. Post- and prior-barrier spacers may be of the same composition or of different composition. Thickness of post- and prior-barrier spacers are optionally in the range of 0.1 nm to 1.5 nm.

In one embodiment, the post- and prior-barrier spacers are of higher Al-composition than their main barrier. For example, post- and prior-barrier spacers can be made of 0.26-0.52 nm-thick AlN layer.

In another embodiment, the post- and prior-barrier spacers are of lower Al-composition than the well. For example, post- and prior barrier spacers can be made of 0.1-0.52 nm-thick GaN layer.

In still another embodiment according to this aspect of the present invention, at least a post- and/or prior-barrier spacer is made of AlGaN thin layer with Al-composition higher than the barrier, while at least a post- and/or prior-barrier spacer is made of AlGaN thin layer with Al-composition less than the well. Optionally, at least one thin AlGaN spacer is made of AlN and at least one thin AlGaN spacer is made of GaN, with thickness in the range of 0.1-0.52 nm.

Figure 25:
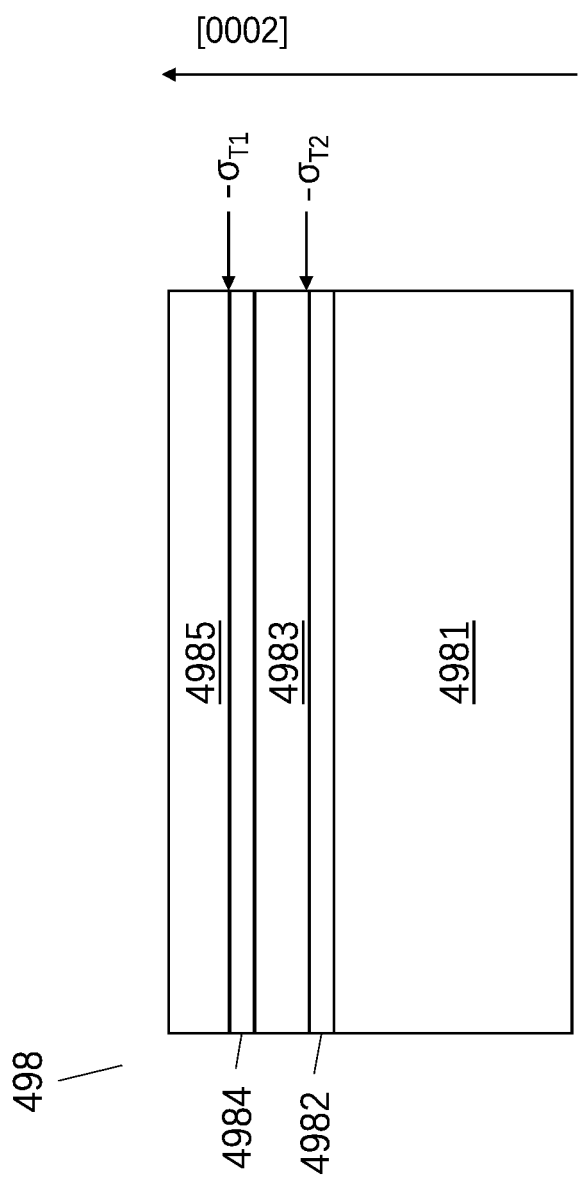
FIG. 25 illustrates a cross-sectional view of a p-type AlGaN/n-type AlInGaN heterostructure according to an embodiment of the present invention.
Figures 26A, 26B:
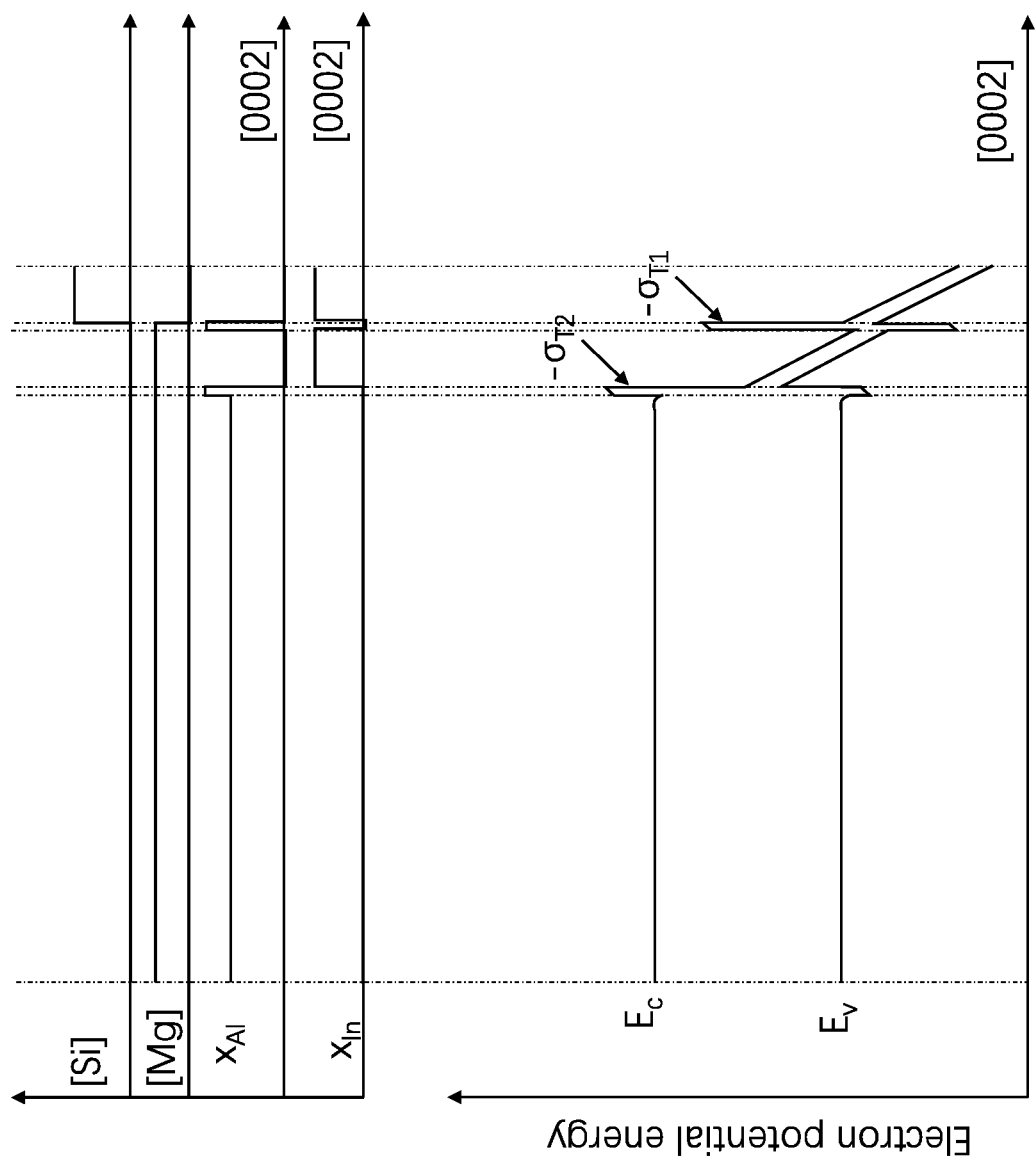
FIG. 26A illustrates one possible combination of dopant and composition profiles of the p-type AlGaN/n-type AlInGaN heterostructure shown in FIG. 23.
FIG. 26B illustrates the band diagram of the p-type AlGaN/n-type AlInGaN heterostructure shown in FIG. 24A.

According to still another aspect of the present invention, illustrated in FIG. 25 is a cross-sectional schematic of heterostructure 498, serving as a p-type contact layer to UV LED 1 shown in FIG. 7. Heterostructure 498 contains heavily Mg-doped layers including AlGaN layer 4981, AlGaN barrier 4982, AlInGaN well 4983, and AlGaN barrier 4984, and a heavily Si-doped AlInGaN well 4985. An exemplary combination of doping and composition profiles is illustrated in FIG. 26A, with band diagram shown in FIG. 26B.

AlGaN layer 4981, in contact with the last layer of heterostructure 40 or other suitable p-type AlGaN structure, or being the last layer of heterostructure 40 or other suitable p-type AlGaN structure, possesses high Al-composition to ensure transparency to the UV emissions generated by MQW 30. For example, the Al-composition and thickness of layer 4981 can be in the range of 0.5-0.65 and 2.0-5.0 nm, respectively. AlGaN layer 4981 can be p-type doped such as Mg-doped with a doping concentration of $5.0 \times 10^{19}$-$3.0 \times 10^{20}$ cm$^{-3}$. Barrier 4982 has higher Al-composition than layer 4981, for example, 0.1-0.5 higher than that of layer 4981. Barrier 4982 is optionally a thin Mg-doped AlN layer. Well 4983 has small Al-composition or vanishing Al-composition, for example 0.0-0.4, or optionally has no Al-composition but has In-composition. It is desirable to have large composition discontinuity at the interface of barrier 4982 and well 4983, so that high-density negative sheet charge ($-\sigma_{T2}$ shown in FIGS. 26A and 26B) is generated therein. High-density interface sheet charge is used to dramatically tilt down the band edge of well 4983. For this purpose, according to the present invention, $\sigma_{T2} \geq 3 \times 10^{13}$ e·cm$^{-2}$, i.e., $-\sigma_{T2} \leq 3 \times 10^{13}$ e·cm$^{-2}$ is preferred. If barrier 4982 and well 4983 are made of AlGaN, this requires the Al-composition difference of barrier 4982 and well 4983 to be equal to or larger than 0.6 (referring to eq. 8).

Barrier 4894 also needs to be of high Al-composition, optional to be made of Mg-doped AlN. Well 4985 has small Al-composition or vanishing Al-composition, for example 0.0-0.4, or optionally has no Al-composition but has In-composition. It is desirable to have large composition discontinuity at the interface of barrier 4984 and well 4985, so that high-density negative sheet charge ($-\sigma_{T1}$ shown in FIGS. 26A and 26B) is generated therein. High-density interface sheet charge is used to dramatically tilt down the band edge of well 4985. For this purpose, according to the present invention, $\sigma_{T1} \geq 3 \times 10^{13}$ e·cm$^{-2}$, i.e., $-\sigma_{T1} \leq 3 \times 10^{13}$ e·cm$^{-2}$ is preferred. If barrier 4984 and well 4985 are made of AlGaN, this requires the Al-composition difference of barrier 4984 and well 4985 to be equal to or larger than 0.6 (referring to eq. 8).

With removal of Al-composition from and addition of In-composition into wells 4983 and 4985, interface sheets of high-density charge ($\sigma_{T1}$, $\sigma_{T2} >> 3 \times 10^{13}$ e·cm$^{-2}$) can be obtained, according to FIGS. 5B, 5C, 6B, and 6C. In this regard, barriers 4982 and 4984 are preferred to be made of thin Mg-doped AlN, and wells 4983 and 4985 are preferred to be made of thin GaN or InGaN (e.g., In-composition of 0.1-0.3). The thickness of barriers 4982 and 4984 is in the range of 0.26-2.0 nm, and the thickness of wells 4983 and 4985 is in the range of 0.52-3.0 nm, respectively. The thickness of barriers 4982 and 4984 may be the same or different. The thickness of wells 4983 and 4985 may be the same or different. The ultrathin film feature of barriers 4982, 4984 and wells 4983, 4985 allows for good vertical conduction for carriers injected from p-contact 62 and high UV-transparency for photons generated from MQW 30. Further, well 4983 can be heavily Mg-doped, in the range of $5.0 \times 10^{19}$-$3.0 \times 10^{20}$ cm$^{-3}$, and well 4985 can be heavily Si-doped, in the range of $1.0 \times 10^{19}$-$1.5 \times 10^{20}$ cm$^{-3}$. Barriers 4982 and 4984 can be Mg-doped with a doping concentration of $5.0 \times 10^{19}$-$3.0 \times 10^{20}$ cm$^{-3}$.

The high-density interface sheet charge will dramatically tilt down the band edge of the narrow-band-gap wells 4983 and 4985, turning wells 4983 and 4985 respectively into a p$^+$ layer because of hole accumulation and an n$^+$ layer because of electron accumulation. As the so-formed p$^+$ layer (4983) and n$^+$ layer (4985) are in each other's close vicinity (only separated by a thin AlN layer (4984)), and electrons in the valence band of well 4983 see lower energy states in the conduction band of well 4985 (refer to FIG. 26B), electrons in the valance band of well 4983 can tunnel to conduction band of well 4985, upon a positive electrical bias on well 4985. Extracting electrons from the valence band of well 4983 is identical to injecting holes into the valence band of well 4983. That is to say, p-type contact layer heterostructure 498 forms a tunnel junction to provide carrier injection from p-ohmic contact 61 to p-type AlGaN heterostructure 40 hence MQW 30.

Since well 4985 is an n$^+$ layer because of electron accumulation on the surface, metals used to make p-ohmic contact 61 can be selected from a large group of metals. In one embodiment, p-ohmic contact 61 can be made of thin Ti/Al/Ti/Au with respective layer thickness of 3-40/70-80/10-20/80-100 nm, for example 3.5/75/15/90 nm. In another embodiment, p-ohmic contact 61 can be made of V/Al/V/Au with respective layer thickness of 3-80/70-150/10-50/20-800 nm, for example 4.0/100/20/60 nm (just as n-ohmic contact 51, need to claim this). High work function metals such as Nickel (Ni), tungsten (W), Palladium (Pd), Platinum (Pt), Iridium (Ir), Osmium (Os), Rhodium (Rh) and Molybdenum (Mo) may also be used in the p-ohmic contact. In one embodiment, p-ohmic contact 61 is made of Ni/Rh with respective layer thickness of 3-10/30-150 nm. The use of Al and Rd in p-ohmic contact 61 enhances UV reflectivity for better light extraction efficiency.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A heterostructure for a light emitting device or a photodetector, comprising:
    one or more p-type doped AlGaN layers, each of the one or more p-type doped AlGaN layers containing one or more sheets of positive charge inserted therein, wherein a distance between two adjacent sheets of positive charge is larger than a depletion depth of a depletion zone generated by any one of the two adjacent sheets of positive charge; and
    a plurality of p-type doped AlGaN layers, which do not contain a sheet of positive charge therein, alternately stacked with the one or more p-type doped AlGaN layers containing one or more sheets of positive charge, wherein an Al-composition of each of the plurality of p-type doped AlGaN layers which do not contain a sheet of positive charge therein is higher than an Al-composition of neighboring p-type doped AlGaN layers containing one or more sheets of positive charge, or an Al-composition of each of the plurality of p-type doped AlGaN layers which do not contain a sheet of positive charge therein is lower than an Al-composition of neighboring p-type doped AlGaN layers containing one or more sheets of positive charge.

2. The heterostructure of claim 1, wherein the depletion depth of a depletion zone generated by any one of the one or more sheets of positive charge is less than 10 nm.

3. The heterostructure of claim 1, wherein the one or more sheets of positive charge are formed by Si-delta doping with a sheet doping density of $1 \times 10^{11}$-$1 \times 10^{13}$ cm$^{-2}$.

4. The heterostructure of claim 1, wherein the p-type doped AlGaN layer to be placed closest to an active-region of the light emitting device or photodetector, compared with the rest of the one or more p-type doped AlGaN layers, contains more sheets of positive charge, higher Al-composition, and larger thickness.

5. The heterostructure of claim 1, wherein the sheet of positive charge divides each of the one or more p-type doped AlGaN layers containing one or more sheets of positive charge into a thinner prior zone and a thicker post zone.

6. The heterostructure of claim 1, further comprising another p-type doped AlGaN layer on which the one or more p-type doped AlGaN layers are formed, wherein the another p-type doped AlGaN layer has an Al-composition in the range of 0.6-0.8 and a thickness in the range of 1.0-5.0 nm.

7. A light emitting device comprising:
an n-type AlGaN structure;
a p-type AlGaN structure; and
an active-region sandwiched between the n-type AlGaN structure and the p-type AlGaN structure,
wherein the p-type AlGaN structure comprises the heterostructure of claim 1.

* * * * *